United States Patent
Yamada et al.

(10) Patent No.: US 10,083,938 B2
(45) Date of Patent: Sep. 25, 2018

(54) SEMICONDUCTOR MODULE AND ELECTRONIC DEVICE

(71) Applicant: FUJITSU LIMITED, Kawasaki-shi, Kanagawa (JP)

(72) Inventors: Mitsutaka Yamada, Atsugi (JP); Masumi Suzuki, Kawasaki (JP); Michimasa Aoki, Kawasaki (JP); Jie Wei, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/381,857

(22) Filed: Dec. 16, 2016

(65) Prior Publication Data
US 2017/0207144 A1 Jul. 20, 2017

(30) Foreign Application Priority Data
Jan. 14, 2016 (JP) .................. 2016-005072

(51) Int. Cl.
| | |
|---|---|
| H01L 23/46 | (2006.01) |
| H01L 25/065 | (2006.01) |
| H01L 25/16 | (2006.01) |
| H01L 23/04 | (2006.01) |
| H01L 23/44 | (2006.01) |

(52) U.S. Cl.
CPC .......... *H01L 25/0657* (2013.01); *H01L 23/04* (2013.01); *H01L 23/44* (2013.01); *H01L 23/46* (2013.01); *H01L 25/165* (2013.01); *H01L 2224/16145* (2013.01); *H01L 2224/16227* (2013.01); *H01L 2225/06513* (2013.01); *H01L 2225/06541* (2013.01); *H01L 2225/06555* (2013.01); *H01L 2225/06582* (2013.01); *H01L 2225/06589* (2013.01)

(58) Field of Classification Search
None
See application file for complete search history.

(56) References Cited

U.S. PATENT DOCUMENTS

2002/0113142 A1* 8/2002 Patel .................. H01L 23/4735
239/128

FOREIGN PATENT DOCUMENTS

| JP | 2012-253104 A | 12/2012 |
|---|---|---|
| JP | 2013-16569 A | 1/2013 |

* cited by examiner

*Primary Examiner* — Cheung Lee
(74) *Attorney, Agent, or Firm* — Fujitsu Patent Center

(57) ABSTRACT

A semiconductor module includes: a container through which a refrigerant flows; a semiconductor device installed within the container and having an internal path through which the refrigerant flows; and a guide member installed within the container to adjust a first flow rate of the refrigerant flowing through the internal path, and a second flow rate of the refrigerant flowing outside the semiconductor device.

16 Claims, 32 Drawing Sheets

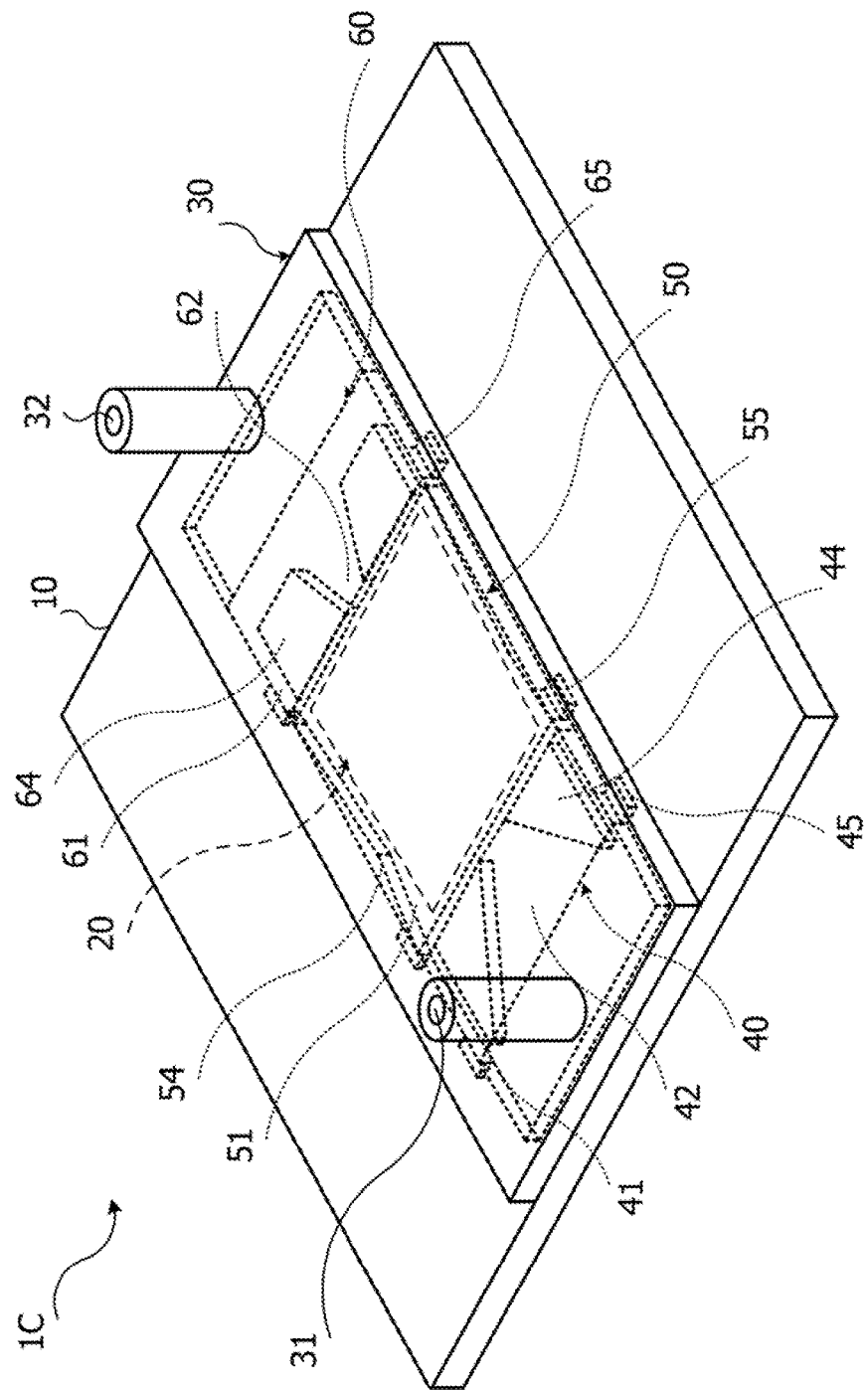

SEMICONDUCTOR MODULE AND ELECTRONIC DEVICE

CROSS-REFERENCE TO RELATED APPLICATIONS

This application is based upon and claims the benefit of priority of the prior Japanese Patent Application No. 2016-005072 filed on Jan. 14, 2016, the entire contents of which are incorporated herein by reference.

FIELD

The embodiments discussed herein are related to a semiconductor module and an electronic device.

BACKGROUND

There is known a technology of cooling a semiconductor device being heated according to operations using a refrigerant in a liquid or gas state.

For example, there is known a method of covering a stacked module including a group of stacked semiconductor chips with a cover, and causing a refrigerant to flow into the cover. Also, there is known a method of covering a stacked module in which an interposer having a channel is interposed between semiconductor chips with a cover, dividing the inside of the cover into upstream and downstream spaces by a dam that covers the outside of the stacked module, and causing a refrigerant to flow into only the channel of the interposer.

For example, in a semiconductor device having an internal path through which a refrigerant flows as in the above described stacked module, when a structure where the refrigerant more easily flows through the outside of the semiconductor device than through the internal path is employed, a sufficient cooling effect may not be obtained so that, for example, a temperature rise is caused in the vicinity of a central portion of the semiconductor device.

When a structure where a dam is provided outside a semiconductor device so that a refrigerant flows into only the internal path of the semiconductor device is employed, a sufficient cooling effect may not be obtained so that, for example, a temperature rise is caused in the vicinity of the outside of the semiconductor device (i.e., the end portion of the semiconductor device).

When a sufficient cooling effect is not obtained in the semiconductor device being heated according to operations, a desired operation may not be implemented so that deterioration in performance and reliability may be caused in the semiconductor device and the semiconductor module using the same, and hence an electronic device mounted with the semiconductor module.

The following is a reference document.
[Document 1] Japanese Laid-open Patent Publication No. 2012-253104.

SUMMARY

According to an aspect of the invention, a semiconductor module includes: a container through which a refrigerant flows; a semiconductor device installed within the container and having an internal path through which the refrigerant flows; and a guide member installed within the container to adjust a first flow rate of the refrigerant flowing through the internal path, and a second flow rate of the refrigerant flowing outside the semiconductor device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 23 is a view illustrating a configuration example of a semiconductor module according to the fourth embodiment;

DESCRIPTION OF EMBODIMENTS

First, an embodiment of a semiconductor module will be described.

Figure 1A:
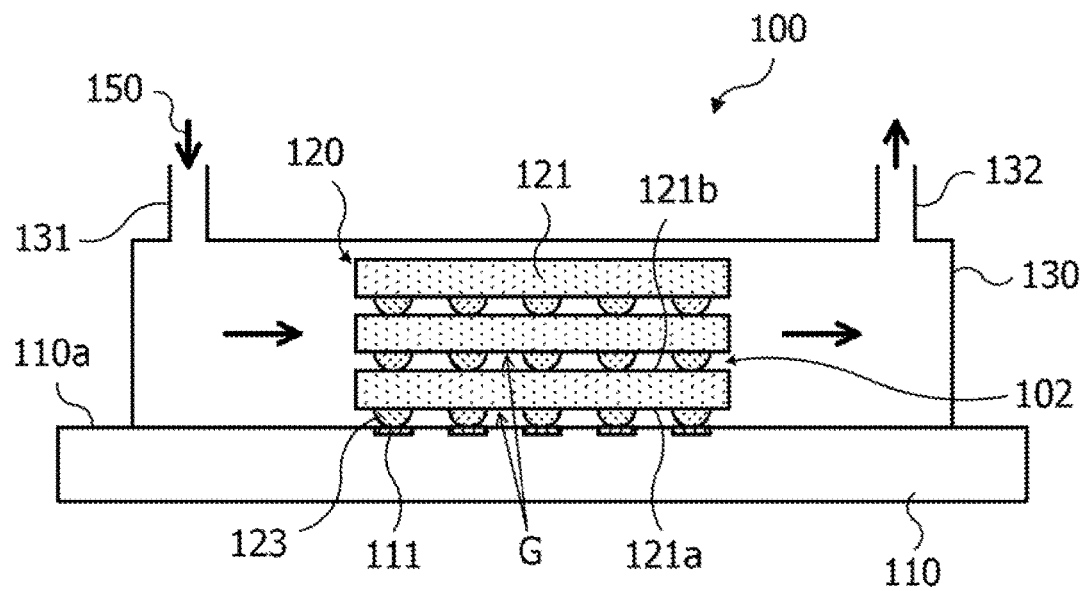
FIGS. 1A and 1B are views illustrating a semiconductor module according to an embodiment.
Figure 1B:
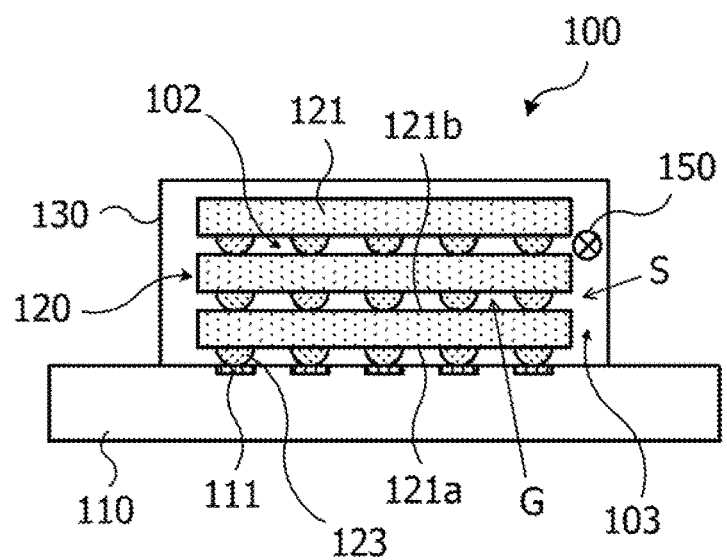

FIGS. 1A and 1B are views illustrating a semiconductor module according to an embodiment. Each of FIGS. 1A and 1B schematically illustrates a section of a main portion of a semiconductor module according to an embodiment. FIG. 1A is a schematic sectional view illustrating a main portion along a direction from upstream to downstream of a refrigerant, and FIG. 1B is a schematic sectional view illustrating a main portion along a direction perpendicular to the direction from upstream to downstream of a refrigerant. The thick arrows illustrated in FIGS. 1A and 1B schematically illustrate a flow of a refrigerant.

A semiconductor module 100 illustrated in FIGS. 1A and 1B includes a circuit board 110, a semiconductor device 120, and a container 130 (cover).

The circuit board 110 is a printed circuit board or the like, and has electrodes 111 provided on one surface 110a thereof. The circuit board 110 includes conductor portions such as wirings and vias (not illustrated) electrically connected to the electrodes 111.

The semiconductor device 120 includes a group of stacked semiconductor elements 121 (semiconductor chips) (here, e.g., a group of three semiconductor elements 121). Electrodes are provided on each of one surface 121a and the other surface 121b of each semiconductor element 121. Bumps 123 using a solder or the like are formed on the electrodes provided on one surface 121a. At least some of the bumps 123 are electrically connected to circuit elements such as transistors (not illustrated) provided within the semiconductor element 121. Through silicon vias (TSVs) (not illustrated) are formed within the semiconductor element 121 using a TSV forming technique or the like. The electrodes provided on the other surface 121b are electrically connected to at least some of the electrodes provided on one surface 121a through the TSVs within the semiconductor element 121.

Between the upper and lower semiconductor elements 121 of the semiconductor device 120, the bumps 123 on the electrodes provided on the surface 121a of the upper semiconductor element 121 are bonded to the electrodes provided on the surface 121b of the lower semiconductor element 121. The bumps 123 of the lowermost semiconductor element 121 of the semiconductor device 120 are bonded to the electrodes 111 provided on the surface 110a of the circuit board 110. The semiconductor device 120 is mounted (installed) on the circuit board 110 in this manner, and electrically and mechanically connected to the circuit board 110.

The semiconductor device 120 including the group of the semiconductor elements 121 is heated according to operations.

In the semiconductor device 120, between vertically adjacent semiconductor elements 121, and between the lowermost semiconductor element 121 and the circuit board 110, a gap G corresponding to the height of a bonding portion including the bumps 123 is present.

The container 130 covers the semiconductor device 120 mounted on the circuit board 110. The container 130 includes a supply port 131 and a discharge port 132 of a refrigerant 150 used for cooling the semiconductor device 120 being heated according to operations. The refrigerant 150 is supplied from the supply port 131 into the container 130, flows through the container 130, and is discharged from the discharge port 132 to the outside of the container 130.

In the semiconductor module 100, as a path of the refrigerant 150 flowing through the container 130, each of gaps G between the semiconductor elements 121 of the semiconductor device 120, and between the semiconductor element 121 and the circuit board 110, i.e., an internal path 102 is present, and a side S of the semiconductor device 120, i.e., an external path 103 is present. In the semiconductor module 100 having the internal path 102 and the external path 103, following problems illustrated in FIGS. 2A and 2B may occur.

Figure 2A:
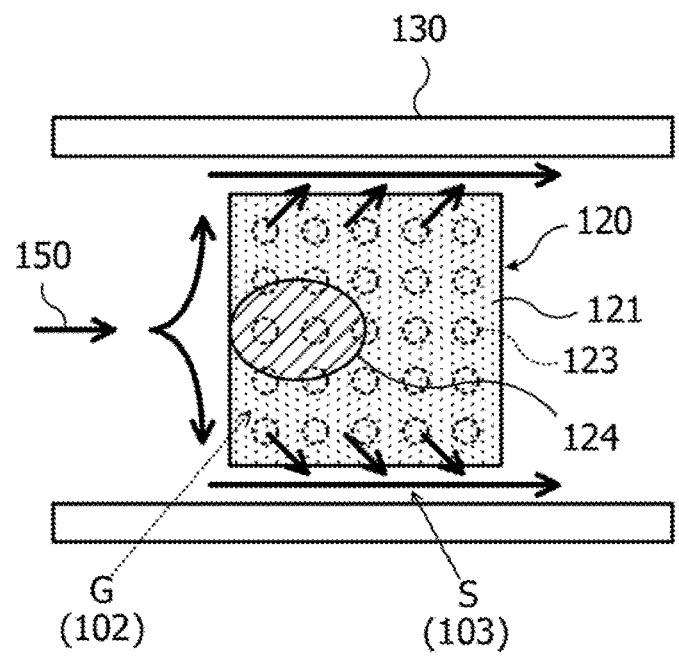
FIGS. 2A and 2B are views illustrating an example of a flow of a refrigerant in the semiconductor module according to an embodiment.
Figure 2B:
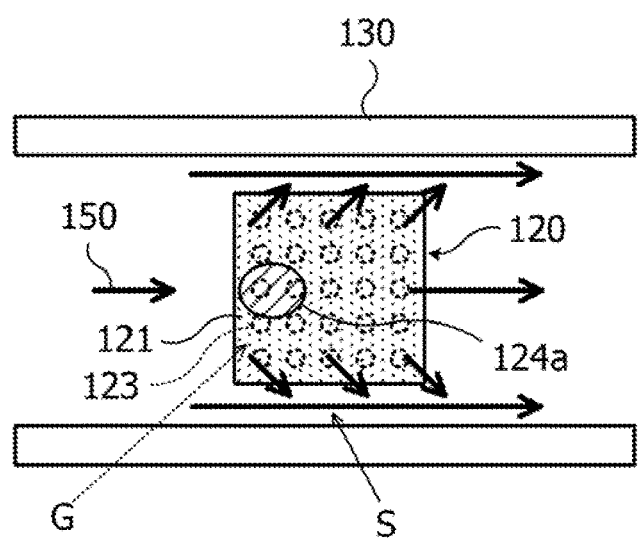

FIGS. 2A and 2B are views illustrating an example of a flow of a refrigerant in the semiconductor module according to an embodiment. Each of FIGS. 2A and 2B schematically illustrates a plan view of a main portion of a semiconductor module according to an embodiment. The thick arrows illustrated in FIGS. 2A and 2B schematically illustrate a flow of a refrigerant.

In the semiconductor module 100 illustrated in FIGS. 1A and 1B, the internal path 102 that is one of paths through which the refrigerant 150 flows is each of gaps G between the semiconductor elements 121 of the semiconductor device 120 and between the semiconductor element 121 and the circuit board 110. The gap G corresponds to the height of a bonding portion including the bumps 123 between the semiconductor elements 121 and between the semiconductor element 121 and the circuit board 110, and generally has a height of up to about 100 µm in the semiconductor device 120 in which the group of the semiconductor elements 121 is stacked.

The refrigerant 150 supplied into the container 130 hardly enters such a size of gap G in the semiconductor device 120. Therefore, the refrigerant 150 easily flows through the side S of the semiconductor device 120 having a relatively small flow resistance, i.e., the external path 103, rather than the gap G of the semiconductor device 120, i.e., the internal path 102.

When the refrigerant 150 supplied into the container 130 preferentially flows through the external path 103 rather than the internal path 102 as described above, the vicinity (the end portion) of the side S of the semiconductor device 120 may be relatively efficiently cooled, while the inner side (the central portion) may be insufficiently cooled. In this case, as illustrated in FIG. 2A, a relatively high temperature portion 124 may occur in the central portion of the semiconductor device 120 so that a temperature variation and local overheating may occur within the semiconductor device 120, thereby causing the performance degradation, damage, or the like of the semiconductor device 120.

In recent years, a semiconductor module 100 employing a semiconductor element 121 and a semiconductor device 120 with a relatively large external size (e.g., h: 20 mm×w: 20 mm) in plan view (a planar size) has also been used. There is a tendency that the situation illustrated in FIG. 2A easily occurs in such a semiconductor module 100 employing a semiconductor element 121 and a semiconductor device 120 with a relatively large planer size.

FIG. 2B illustrates a flow of the refrigerant 150 in a case where the planar size of the semiconductor device 120 is smaller than that of FIG. 2A.

In this case, in the same manner as described above, the refrigerant 150 hardly enters the internal path 102 in the gap G of the semiconductor device 120, and easily flows through the external path 103 at the side S of the semiconductor device 120. When the planar size of the semiconductor device 120 is relatively small, the end portion is relatively efficiently cooled by the refrigerant 150 flowing through the external path 103, and thus the central portion is also cooled to some extent. However, in the semiconductor device 120, the central portion is still easily heated to a higher temperature than the end portion. Then, a relatively high temperature portion 124a may occur so that a temperature variation may occur within the semiconductor device 120, thereby causing the performance degradation, damage, or the like of the semiconductor device 120.

Figure 3A:
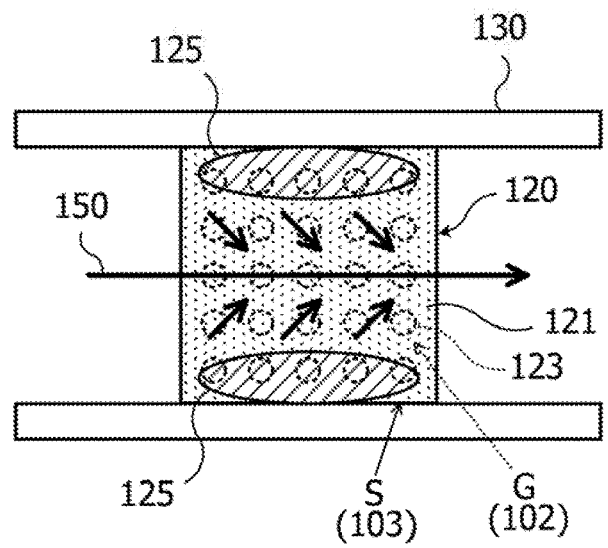
FIGS. 3A and 3B are views illustrating another example of a flow of a refrigerant in the semiconductor module according to an embodiment.
Figure 3B:
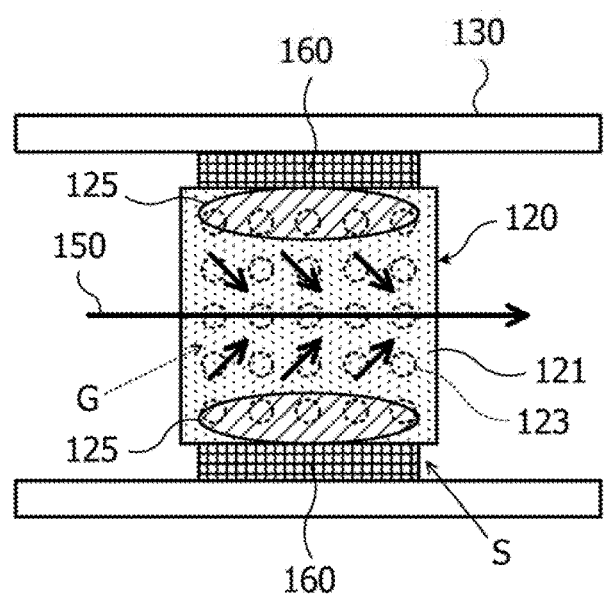

FIGS. 3A and 3B are views illustrating another example of a flow of a refrigerant in the semiconductor module according to an embodiment. Each of FIGS. 3A and 3B schematically illustrates a plan view of a main portion of a semiconductor module according to an embodiment. The thick arrows illustrated in FIGS. 3A and 3B schematically illustrate a flow of a refrigerant.

In order to suppress the above described temperature variation within the semiconductor device 120 due to the easy flow of the refrigerant 150 through the external path 103 at the side S of the semiconductor device 120, it is conceivable to eliminate the external path 103, thereby blocking the flow of the refrigerant 150 through the side S.

For example, as illustrated in FIG. 3A, a side wall of the container 130 is brought into close contact with a side wall of the semiconductor device 120, thereby blocking the refrigerant 150 flowing through the side S of the semiconductor device 120. Otherwise, for example, as illustrated in FIG. 3B, a dam 160 is provided between a side wall of the container 130 and a side wall of the semiconductor device 120, so that the refrigerant 150 flowing through the side S of the semiconductor device 120 is blocked by the dam 160. When the refrigerant 150 flowing through the side S of the semiconductor device 120 is blocked in this manner, the refrigerant 150 is allowed to flow through the internal path 102 in the gap G of the semiconductor device 120.

However, as described above, the internal path 102 of the semiconductor device 120 is a relatively narrow gap G that corresponds to the height of a bonding portion including the bumps 123 between the semiconductor elements 121 and between the semiconductor element 121 and the circuit board 110. For this reason, in order to block the side S of the semiconductor device 120 and to flow the refrigerant 150 through the gap G, the pressure of the refrigerant 150 to be supplied into the container 130 must be increased. This may cause an increase of a cost required for an operation or the like of the semiconductor module 100.

Further, in order to block the refrigerant 150 flowing through the side S of the semiconductor device 120, a relatively high temperature portion 125 may also occur in the end portion of the semiconductor device 120 so that a temperature variation and local overheating may occur, thereby causing the performance degradation, damage, or the like of the semiconductor device 120.

As described above, within the semiconductor device 120 that is a cooling target, a temperature variation may occur so that a sufficient cooling effect of the semiconductor device 120 may not be obtained. When the semiconductor device 120 is not sufficiently cooled, a desired operation may not be implemented, and thus, deterioration in performance and reliability may be caused in the semiconductor device 120 and the semiconductor module 100 using the same, and further an electronic device mounted with the semiconductor module 100.

In view of the problems described above, herein, a sufficient cooling effect of a semiconductor device (a group of semiconductor elements) arranged within a container through which a refrigerant flows may be achieved using the following technique illustrated as embodiments.

First, a first embodiment will be described.

Figure 4A:
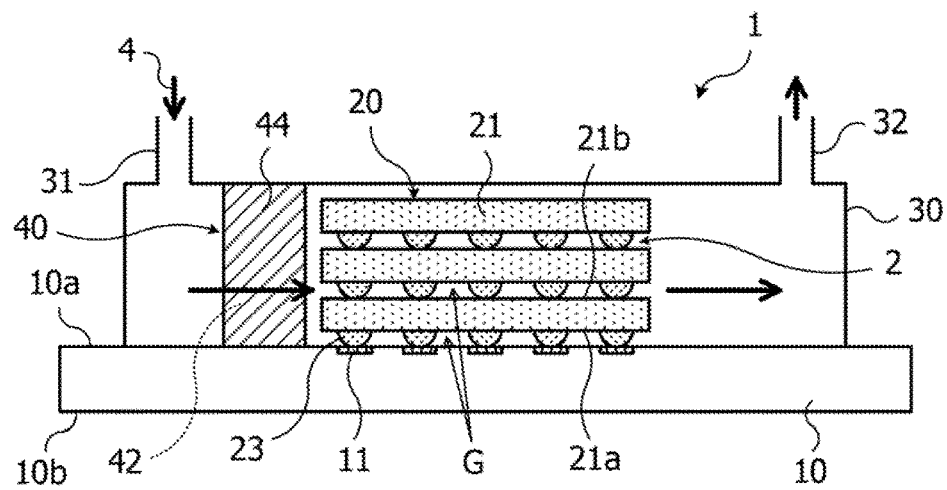
FIGS. 4A to 4C are views illustrating an exemplary semiconductor module according to a first embodiment.
Figure 4B:
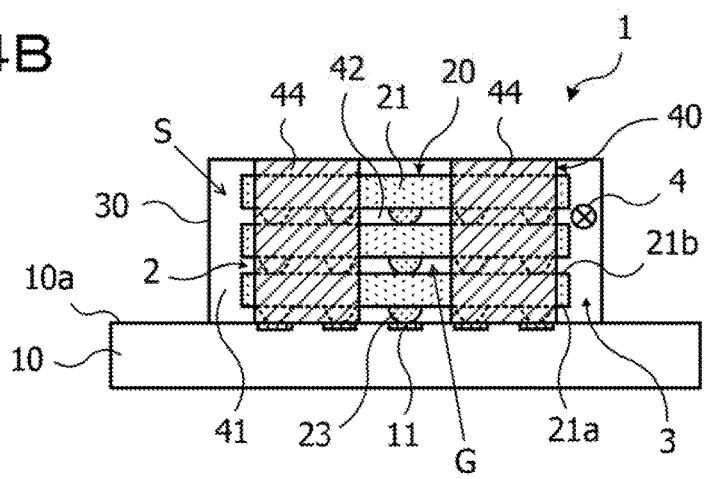
Figure 4C:
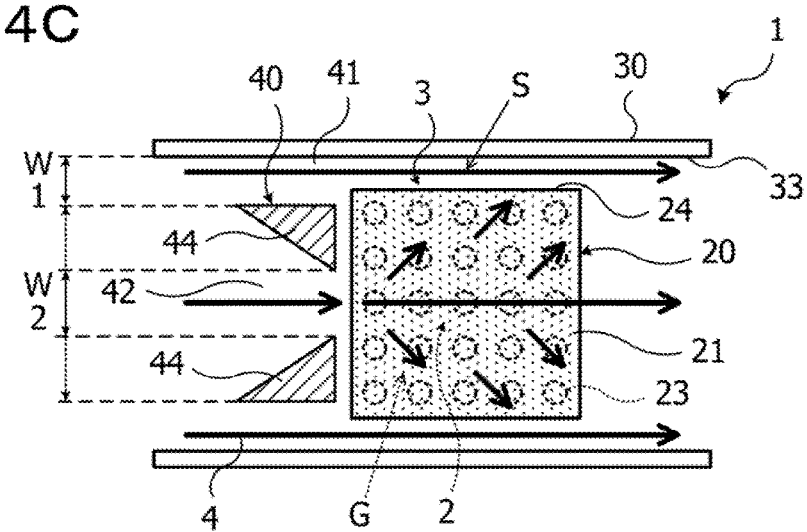

FIGS. 4A to 4C are views illustrating an exemplary semiconductor module according to a first embodiment. Each of FIGS. 4A and 4B schematically illustrates a section of a main portion of the exemplary semiconductor module according to the first embodiment. FIG. 4A is a schematic sectional view illustrating a main portion along a direction from upstream to downstream of a refrigerant, and FIG. 4B is a schematic sectional view illustrating a main portion along a direction perpendicular to the direction from upstream to downstream of a refrigerant. FIG. 4C is a schematic plan view illustrating a main portion of the exemplary semiconductor module according to the first embodiment. The thick arrows illustrated in FIGS. 4A to 4C schematically illustrate a flow of a refrigerant.

A semiconductor module 1 illustrated in FIGS. 4A to 4C includes a circuit board 10, a semiconductor device 20, a container 30, and a guide unit 40 as a guide member.

As the circuit board 10, various circuit boards such as a printed circuit board may be used. The circuit board 10 includes electrodes 11 provided on one surface 10a thereof. A wiring pattern may be formed on the surface 10a of the circuit board 10. The circuit board 10 may also include electrodes provided on the other surface 10b thereof. The circuit board 10 includes conductor portions such as wirings and vias (not illustrated) electrically connected to the electrodes 11.

The semiconductor device 20 includes a group of stacked semiconductor elements 21 (here, e.g., a group of three semiconductor elements 21). Electrodes are provided on each of one surface 21a and the other surface 21b of each semiconductor element 21. Bumps 23 using a solder or the like are formed on the electrodes provided on one surface 21a. At least some of the bumps 23 are electrically connected to circuit elements such as transistors (not illustrated) provided within the semiconductor element 21. TSVs (not illustrated) are formed using a TSV forming technique or the like within the semiconductor element 21. The electrodes provided on the other surface 21b are electrically connected to at least some of the electrodes (the bumps 23 on the electrodes) provided on one surface 21a through the TSVs within the semiconductor element 21.

The upper and lower semiconductor elements 21 of the semiconductor device 20 are electrically and mechanically connected to each other while the bumps 23 on the electrodes provided on the surface 21a of the upper semiconductor element 21 are bonded to the electrodes provided on the surface 21b of the lower semiconductor element 21. The lowermost semiconductor element 21 of the semiconductor device 20 is electrically and mechanically connected to the circuit board 10 while the bumps 23 of the lowermost semiconductor element 21 are bonded to the electrodes 11 provided on the surface 10a of the circuit board 10. The semiconductor device 20 including the group of the semiconductor elements 21 is mounted (installed) on the circuit board 10 in this manner.

The semiconductor device 20 including the group of the semiconductor elements 21 is heated according to operations.

In the semiconductor device 20, between vertically adjacent semiconductor elements 21, and between the lowermost semiconductor element 21 and the circuit board 10, a gap G corresponding to the height of a bonding portion including the bumps 23 is present.

The container 30 covers the semiconductor device 20 mounted on the circuit board 10. The container 30 includes a supply port 31 and a discharge port 32 of a refrigerant 4 used for cooling the semiconductor device 20 being heated according to operations. The refrigerant 4 is supplied from the supply port 31 into the container 30, flows through the container 30, and is discharged from the discharge port 32 to the outside of the container 30.

For example, the refrigerant 4 may be circulated and cooled outside the container 30, and returned into the container 30. As the refrigerant 4, various refrigerants in a liquid or gas state may be used. For example, as the refrigerant 4, a fluorine-based inert liquid is used.

The guide unit 40 is provided at the upstream of the refrigerant 4 in the semiconductor device 20 arranged within the container 30. The guide unit 40 includes a pair of guides 44, and includes a flow path 41 and a flow path 42 which split the refrigerant 4 supplied from the supply port 31. The flow path 41 and the flow path 42 are formed at one side (a side wall 33 side of the container 30) and the other side (the center side of the container 30) across each guide 44, respectively.

The flow path 41 of the guide unit 40 is formed along the side wall 33 of the container 30. The flow path 41 is communicated with an external path 3 that is one of paths of the refrigerant 4 in the semiconductor module 1. Here, the external path 3 corresponds to the side S of the semiconductor device 20, that is, a path between the side wall 33 of the container 30 and a side wall 24 of the semiconductor device 20 in the present example.

The flow path 42 of the guide unit 40 is formed at the inner side of the flow path 41 (the center side), and becomes narrower in the flow passage area of the refrigerant 4 (e.g., the width W2 of the flow path 42) while getting closer to the semiconductor device 20. The flow path 42 is communicated with an internal path 2 that is one of paths of the refrigerant 4 in the semiconductor module 1. Here, the internal path 2 corresponds to each of gaps G between the semiconductor elements 21 of the semiconductor device 20 and between the semiconductor element 21 and the circuit board 10.

The guide unit 40 may be formed using various materials such as a metal material, a ceramic material, or a resin material.

In the semiconductor module 1 including the guide unit 40, the refrigerant 4 supplied from the supply port 31 into the container 30 diverges into the flow path 41 and the flow path 42 of the guide unit 40. The refrigerant 4 diverging into the flow path 41 side is sent to the external path 3 at the side S of the semiconductor device 20 through the flow path 41. The refrigerant 4 diverging into the flow path 42 side is sent to the central portion of the semiconductor device 20 through the flow path 42.

The guide unit 40 is configured such that the area of the flow path 42 is gradually reduced toward the semiconductor device 20 side. Thus, the refrigerant 4 supplied from the supply port 31 may diverge into the flow path 42 side and flow toward the semiconductor device 20 while a flow resistance is suppressed from being increased. Further, in such a structure where the flow path 42 becomes narrower, the flow velocity of the refrigerant 4 flowing toward the semiconductor device 20 is increased so that the refrigerant 4 may flow into the relatively narrow gap G. Accordingly, a temperature rise may be suppressed at the central portion of the semiconductor device 20 that is being heated according to operations.

The refrigerant 4 that has been supplied from the supply port 31 and diverged into the flow path 41 side by the guide unit 40 flows through the side S of the semiconductor device 20. Accordingly, a temperature rise also may be suppressed at the end portion of the semiconductor device 20 that is being heated according to operations.

By adjusting the area (e.g., the width W1) of the flow path 41 and the area (e.g., the width W2) of the flow path 42 according to the shape and arrangement of the guide unit 40, the flow rate of the refrigerant 4 flowing through each of the flow path 41 and the flow path 42 may be adjusted. Accordingly, the flow rate of the refrigerant 4 flowing through the internal path 2 in the gap G of the semiconductor device 20, and the flow rate of the refrigerant 4 flowing through the external path 3 at the side S of the semiconductor device 20 may be adjusted, respectively.

As an example, the width W1 of the flow path 41 and the external path 3 ranges from 0.1 mm to 1.0 mm, and the width W2 of the flow path 42 ranges from 0.1 mm to 3.0 mm. Also, the height of the flow path 41 and the flow path 42 corresponds to the height of the container 30 (the inner space thereof) on the circuit board 10, or the mounting height of the semiconductor device 20.

By the guide unit 40 provided within the container 30, a temperature variation and local heating of the semiconductor device 20 may be suppressed when the semiconductor device 20 being heated according to operations is cooled with the refrigerant 4, thereby suppressing the performance degradation, damage, or the like of the semiconductor device 20. Accordingly, the semiconductor module 1 with a high performance and reliability may be realized.

Hereinafter, the guide unit 40 will be further described.

Figure 5A:
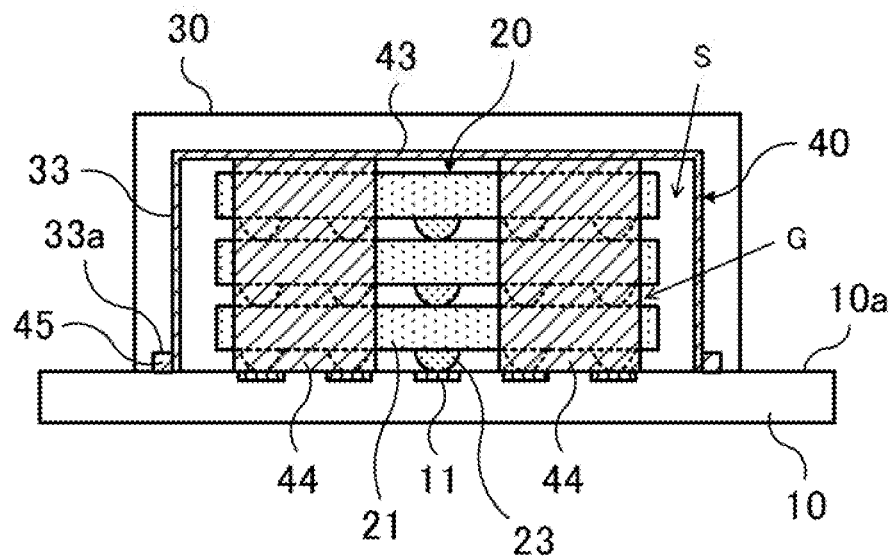
FIGS. 5A and 5B are explanatory views of a method of fixing a guide unit according to the first embodiment.
Figure 5B:
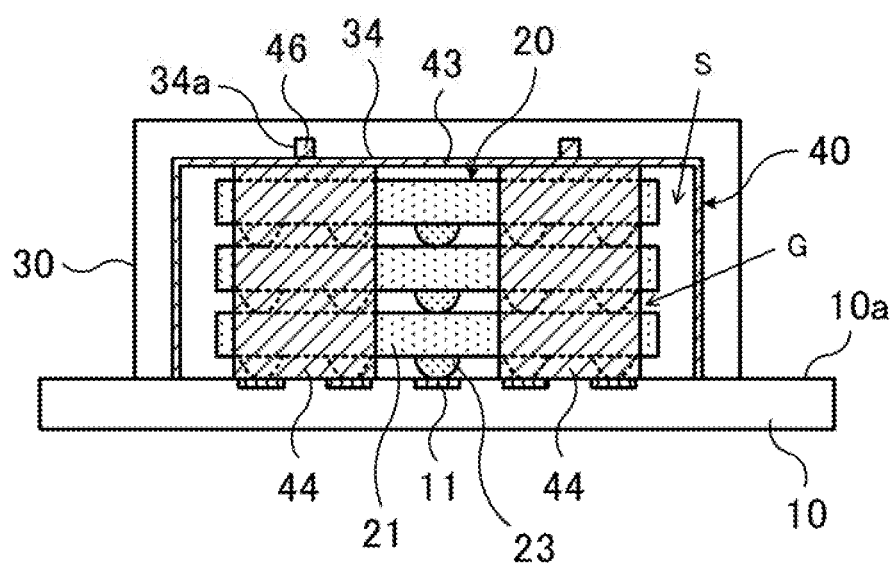

FIGS. 5A and 5B are explanatory views of a method of fixing the guide unit according to the first embodiment. Each of FIGS. 5A and 5B schematically illustrates a section of a main portion of the exemplary semiconductor module according to the first embodiment. FIGS. 5A and 5B are schematic sectional views illustrating a main portion along a direction perpendicular to a direction from upstream to downstream of a refrigerant.

For example, as illustrated in FIG. 5A, the guide unit 40 includes a support 43, a pair of guides 44 provided on the support 43, and protrusions 45 protruding laterally from the support 43. The support 43 comes in contact with the inner surface of the container 30, and the protrusions 45 are fitted in recesses 33a of the side wall 33 of the container 30 such that the guide unit 40 is fixed within the container 30. Here, the guide unit 40 may be bonded to the container 30 using an adhesive.

For example, as illustrated in FIG. 5B, the guide unit 40 includes a support 43, a pair of guides 44 provided on the support 43, and protrusions 46 protruding upwardly from the support 43. The support 43 comes in contact with the inner surface of the container 30, and the protrusions 46 are fitted in recesses 34a of a top wall 34 of the container 30 such that the guide unit 40 is fixed within the container 30. Here, the guide unit 40 may be bonded to the container 30 using an adhesive.

For example, the guide unit 40 may be arranged and fixed within the container 30 using the method described with reference to FIGS. 5A and 5B.

The lower ends of the guides 44 may be in contact with the surface 10a of the circuit board 10 as illustrated in FIGS. 5A and 5B, or may not be in contact with the surface 10a according to the structure (e.g., an arrangement of the electrodes 11 or the wiring pattern) of the surface 10a of the circuit board 10.

Configuration examples of the guide unit 40 and the container 30 are illustrated in FIGS. 6A to 6C to FIG. 8.

Figure 6A:
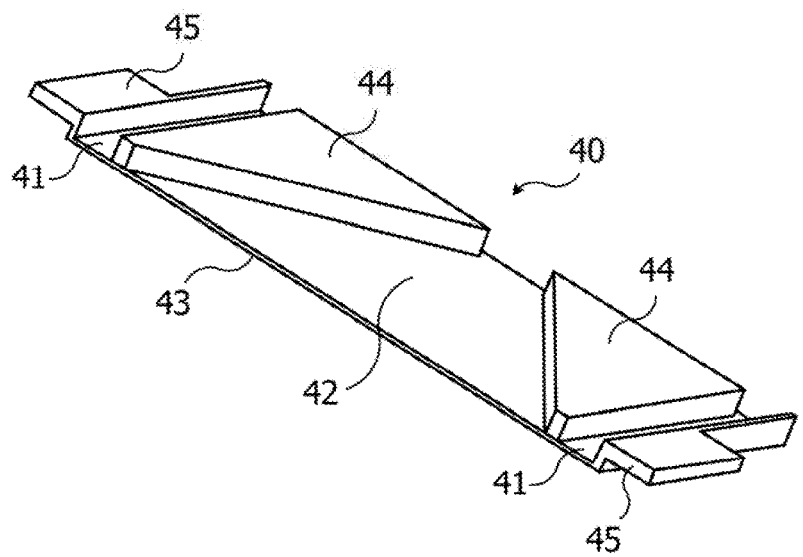
FIGS. 6A to 6C are views illustrating a first configuration example of a guide unit and a container according to the first embodiment.
Figure 6B:
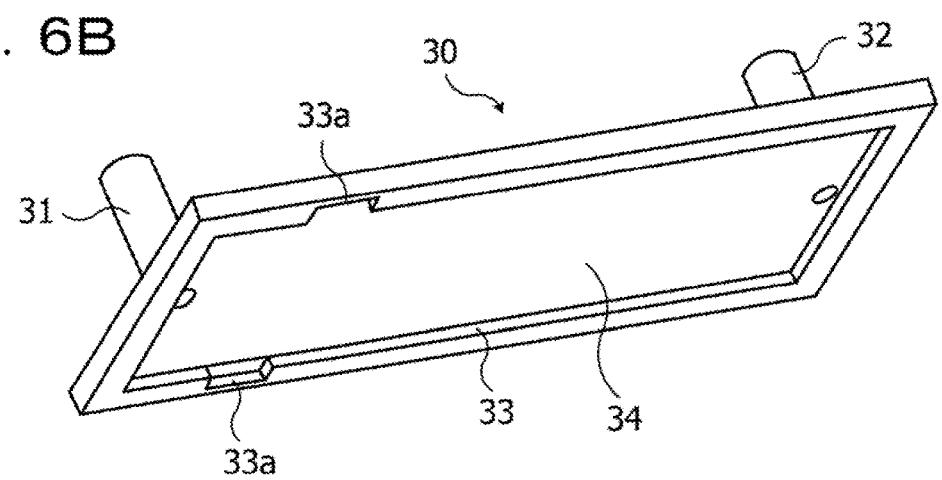
Figure 6C:
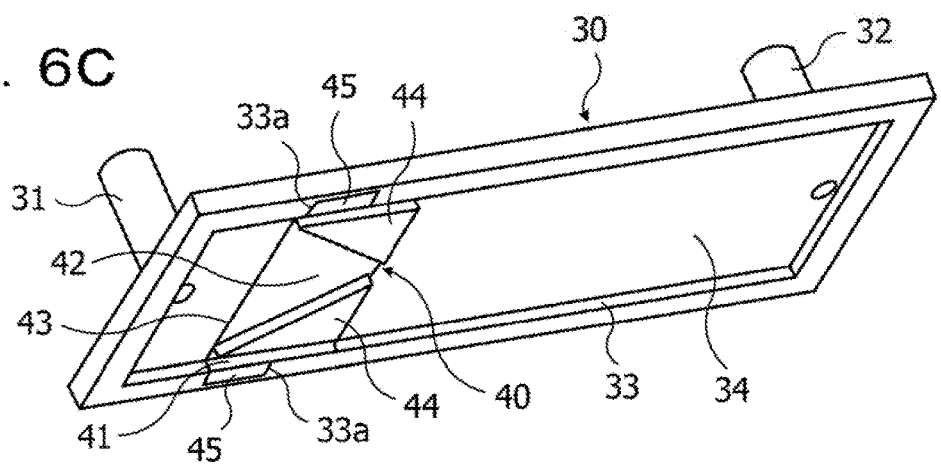

FIGS. 6A to 6C are views illustrating a first configuration example of the guide unit and the container according to the first embodiment. FIG. 6A is a schematic perspective view illustrating the guide unit according to the first configuration example. FIG. 6B is a schematic perspective view illustrating the container according to the first configuration example. FIG. 6C is a schematic perspective view illustrating the guide unit and the container according to the first configuration example.

As illustrated in FIG. 6A, the guide unit 40 according to the first configuration example includes a support 43, a pair of guides 44, and protrusions 45. A narrower width between the pair of guides 44 corresponds to a side of the semiconductor device 20 (FIGS. 4A to 4C) arranged within the container 30. The gap between the pair of guides 44 forms a flow path 42 through which the refrigerant 4 flows toward the semiconductor device 20, and the outside of the pair of guides 44 forms flow paths 41 through which the refrigerant 4 flows to the sides S of the semiconductor device 20. The flow path 42 is reduced in the flow passage area toward the semiconductor device 20 side, and the flow path 41 is constant in the flow passage area. The guide unit 40 according to the first configuration example corresponds to the guide unit 40 of FIG. 5A.

As illustrated in FIG. 6B, the container 30 according to the first configuration example includes a top wall 34, a side wall 33, and a supply port 31, and a discharge port 32 of the refrigerant 4. Recesses 33a in which the protrusions 45 of the guide unit 40 are fitted are formed on the side wall 33 of the container 30 at the supply port 31 side (at the upstream of the refrigerant 4).

As illustrated in FIG. 6C, at the inside surrounded by the top wall 34 and the side wall 33 of the container 30, the guide unit 40 is provided by fitting the protrusions 45 in the recesses 33a. The guide unit 40 may be bonded to the container 30 using an adhesive.

Figure 7A:
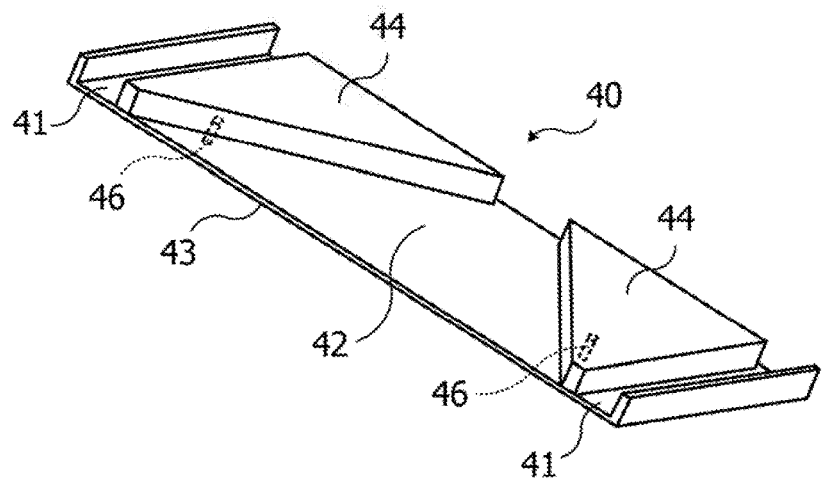
FIGS. 7A to 7C are views illustrating a second configuration example of a guide unit and a container according to the first embodiment.
Figure 7B:
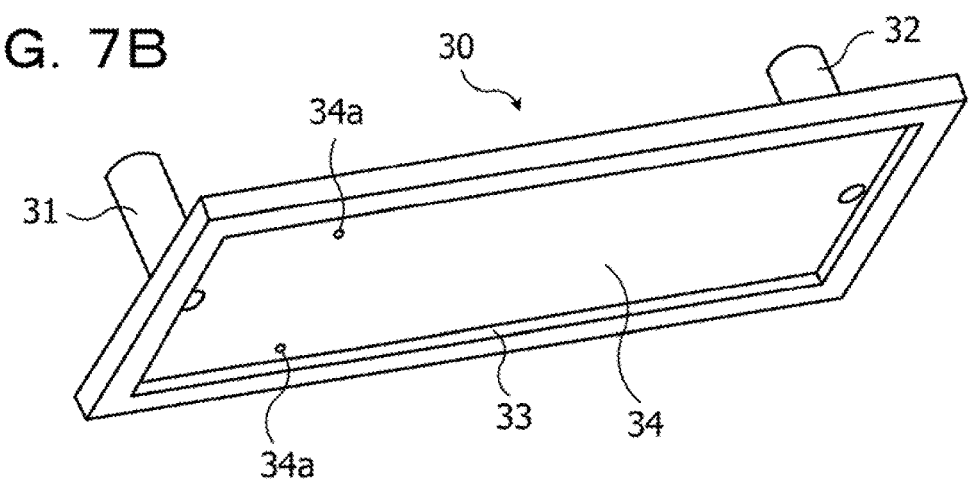
Figure 7C:
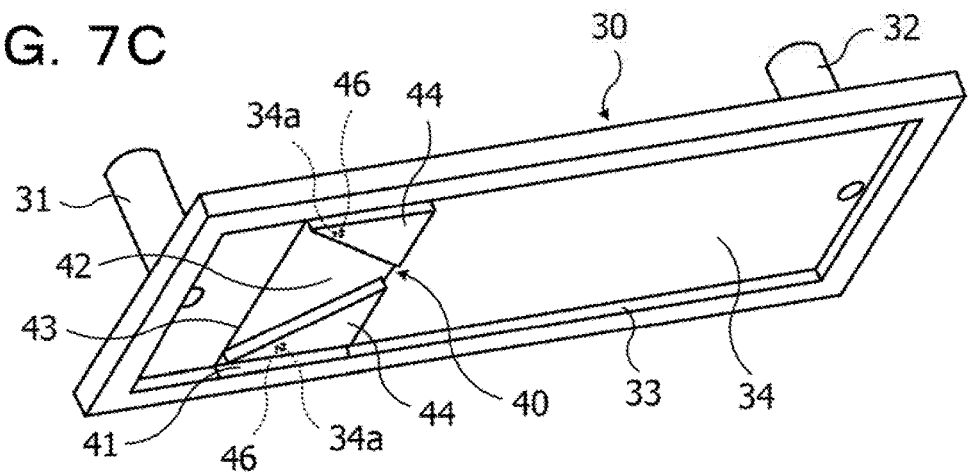

FIGS. 7A to 7C are views illustrating a second configuration example of the guide unit and the container according to the first embodiment. FIG. 7A is a schematic perspective view illustrating the guide unit according to the second configuration example. FIG. 7B is a schematic perspective view illustrating the container according to the second configuration example. FIG. 7C is a schematic perspective view illustrating the guide unit and the container according to the second configuration example.

The guide unit 40 according to the second configuration example, as illustrated in FIG. 7A, includes a support 43, a pair of guides 44 provided on one surface of the support 43, and protrusions 46 formed on the other surface of the support 43. The guide unit 40 according to the second configuration example corresponds to the guide unit 40 of FIG. 5B.

The container 30 according to the second configuration example, as illustrated in FIG. 7B, includes a top wall 34, a side wall 33, and a supply port 31 and a discharge port 32 of the refrigerant 4. Recesses 34a in which the protrusions 46 of the guide unit 40 are fitted are formed at the top wall 34 of the container 30 at the supply port 31 side (at the upstream of the refrigerant 4).

As illustrated in FIG. 7C, at the inside surrounded by the top wall 34 and the side wall 33 of the container 30, the guide unit 40 is provided by fitting the protrusions 46 in the recesses 34a. The guide unit 40 may be bonded to the container 30 using an adhesive.

Figure 8:
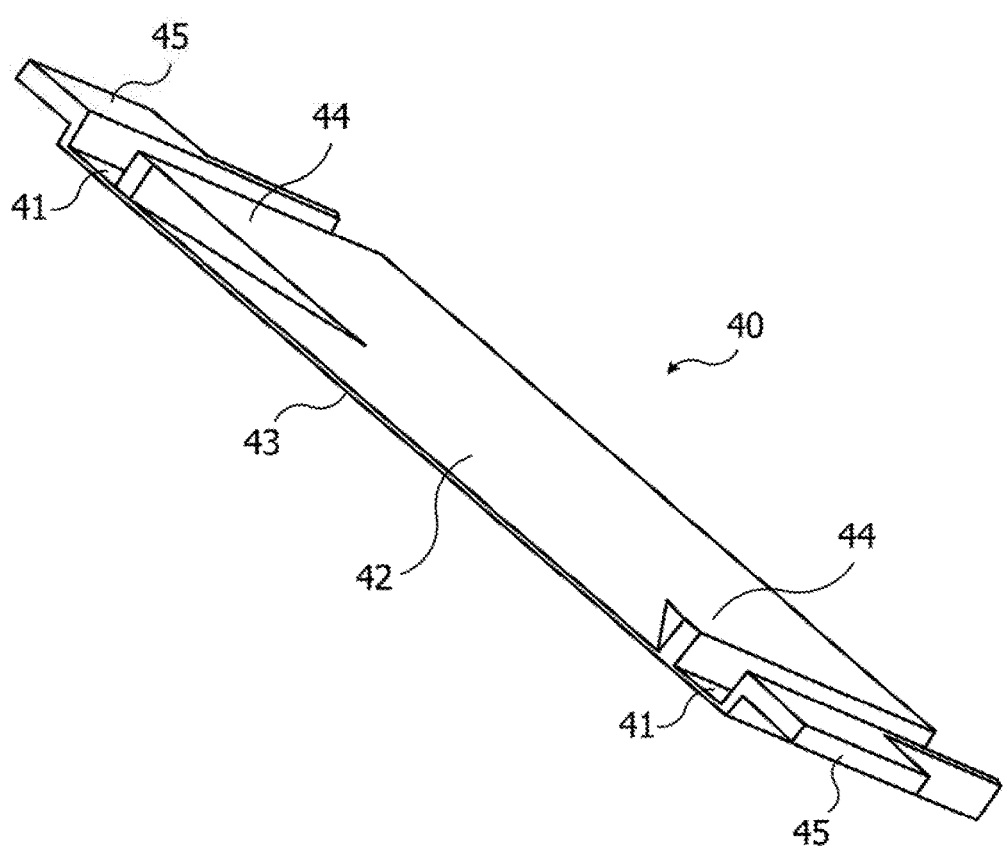
FIG. 8 is a view illustrating a third configuration example of a guide unit according to the first embodiment.

FIG. 8 is a view illustrating a third configuration example of the guide unit according to the first embodiment. FIG. 8 is a schematic perspective view illustrating the guide unit according to the third configuration example.

The guide unit 40 according to the third configuration example is different from the guide unit 40 according to the first configuration example as illustrated in FIG. 6A in that, as illustrated in FIG. 8, a flow path 42 between the pair of guides 44 becomes shallower toward the semiconductor device 20 side (at the downstream of the refrigerant 4, the depth side of the drawing).

The guide unit 40 illustrated in FIG. 8 is provided in the container 30 as illustrated in FIG. 6B, in the manner as illustrated in FIG. 6C. In the guide unit 40 illustrated in FIG. 8, the area of the flow path 42 through which the refrigerant 4 flows toward the semiconductor device 20 is reduced not only in the left-right direction but also in the up-down direction when the semiconductor device 20 is viewed at the upstream of the refrigerant 4. Accordingly, the refrigerant 4 diverging into the flow path 42 side may further intensively flow toward the semiconductor device 20.

In the example illustrated in FIG. 8, protrusions 45 to be fitted in the recesses 33a of the side wall 33 of the container 30 are formed in the guide unit 40. Instead of the protrusions 45, protrusions 46 to be fitted in the recesses 34a of the top wall 34 of the container 30 may be formed on the support 43, and then the guide unit 40 formed with the protrusions 46 may be provided in the container 30 as illustrated in FIG. 7B, in the manner as illustrated in FIG. 7C.

The guide unit 40 may have a configuration including a pair of upper and lower guides instead of the above described configuration including a pair of left and right guides 44 when the semiconductor device 20 is viewed at the upstream of the refrigerant 4.

Figure 9A:
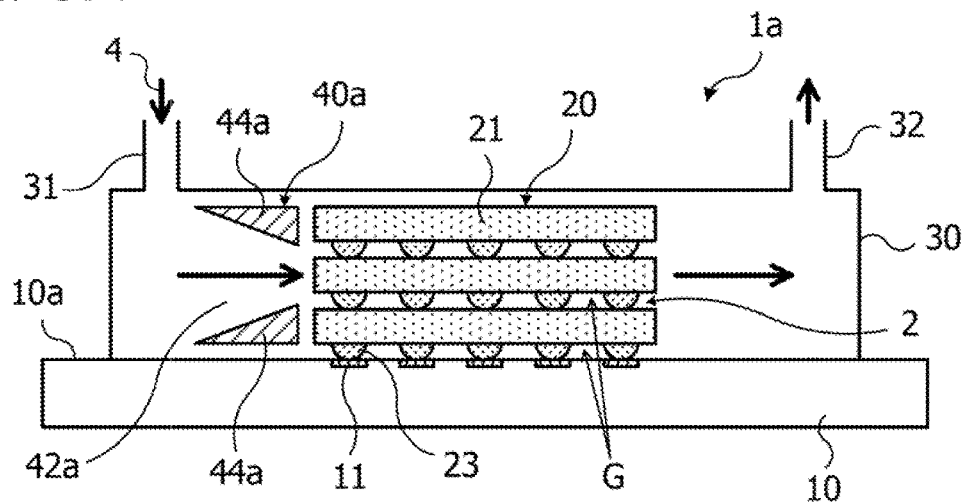
FIGS. 9A to 9C are views illustrating a first modification of a semiconductor module according to the first embodiment.
Figure 9B:
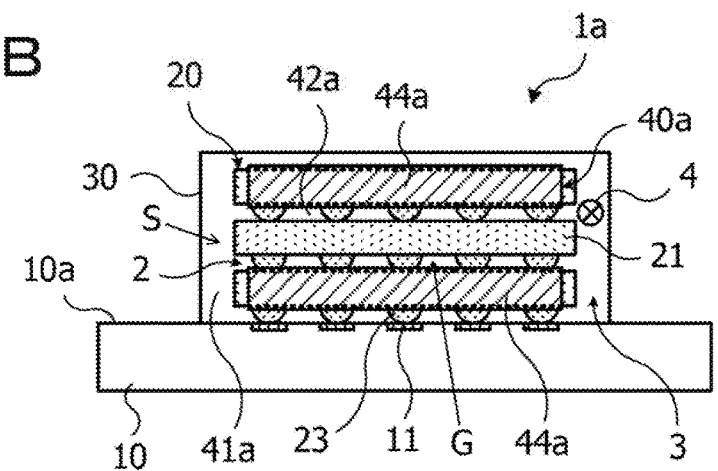
Figure 9C:
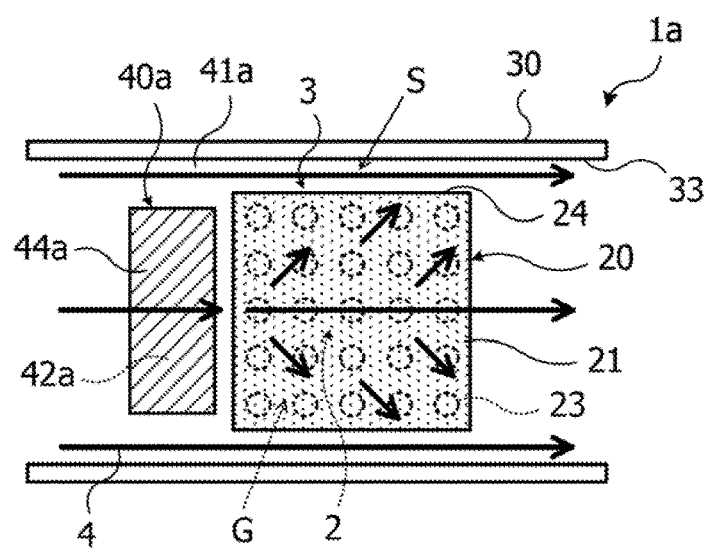

FIGS. 9A to 9C are views illustrating a first modification of a semiconductor module according to the first embodiment. Each of FIGS. 9A and 9B schematically illustrates a section of a main portion of the semiconductor module according to the first modification. FIG. 9A is a schematic sectional view illustrating a main portion along a direction from upstream to downstream of a refrigerant, and FIG. 9B is a schematic sectional view illustrating a main portion along a direction perpendicular to the direction from upstream to downstream of a refrigerant. FIG. 9C is a schematic plan view illustrating a main portion of the semiconductor module according to the first modification.

The thick arrows illustrated in FIGS. 9A to 9C schematically illustrate a flow of a refrigerant.

In a semiconductor module 1a illustrated in FIGS. 9A to 9C, a guide unit 40a includes a pair of upper and lower guides 44a when the semiconductor device 20 is viewed at the upstream of the refrigerant 4. At the outside of the pair of guides 44a, flow paths 41a are formed along side walls 33 of a container 30 to be communicated with the external paths 3 at the sides S of the semiconductor device 20. Between the pair of guides 44a, a flow path 42a in which the flow passage area of the refrigerant 4 becomes narrower toward the semiconductor device 20 is formed to be communicated with the internal path 2 in the gap G. The semiconductor module 1a illustrated in FIGS. 9A to 9C is different from the semiconductor module 1 illustrated in FIGS. 4A to 4C in this aspect.

Also, in the semiconductor module 1a including the guide unit 40a, the refrigerant 4 flows to the side S of the semiconductor device 20 (the external path 3) and the gap G of the semiconductor device 20 (the internal path 2) through the flow path 41a and the flow path 42a, respectively. Since the flow path 42a is formed to be narrower toward the semiconductor device 20 side, the refrigerant 4 may flow into the relatively narrow gap G of the semiconductor device 20 while a flow resistance is suppressed from being increased and a flow velocity is increased.

By adjusting the areas of the flow path 41a and the flow path 42a, the flow rate of the refrigerant 4 flowing through each of the flow path 41a and the flow path 42a may be adjusted. The guide unit 40a may be fixed by fitting protrusions formed in the guide unit 40a in recesses of the side wall 33 or the top wall 34 of the container 30, as in the examples of FIGS. 5A and 5B.

Due to the refrigerant 4 flowing through the flow path 41a and the flow path 42a, a temperature variation of the semiconductor device 20 being heated according to operations may be suppressed, thereby suppressing the performance degradation, damage, or the like of the semiconductor device 20. Thus, the semiconductor module 1a with a high performance and reliability is realized.

Figure 10A:
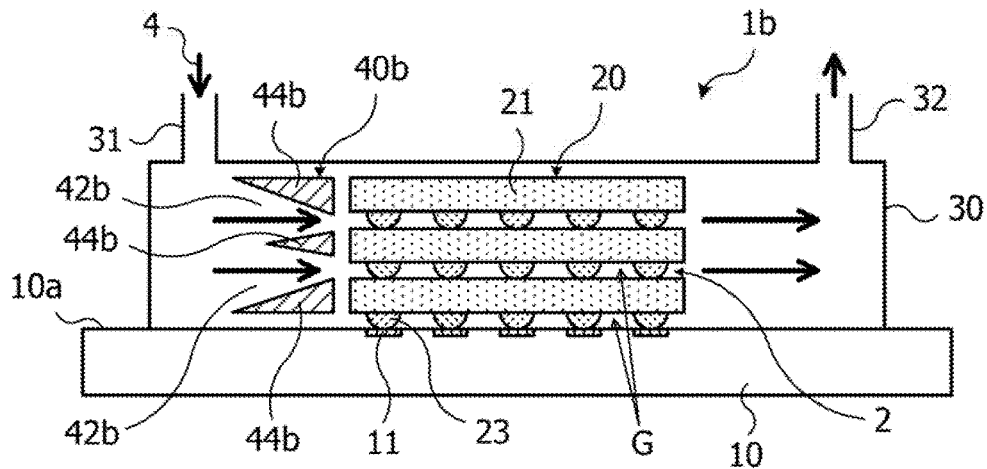
FIGS. 10A to 10C are views illustrating a second modification of a semiconductor module according to the first embodiment.
Figure 10B:
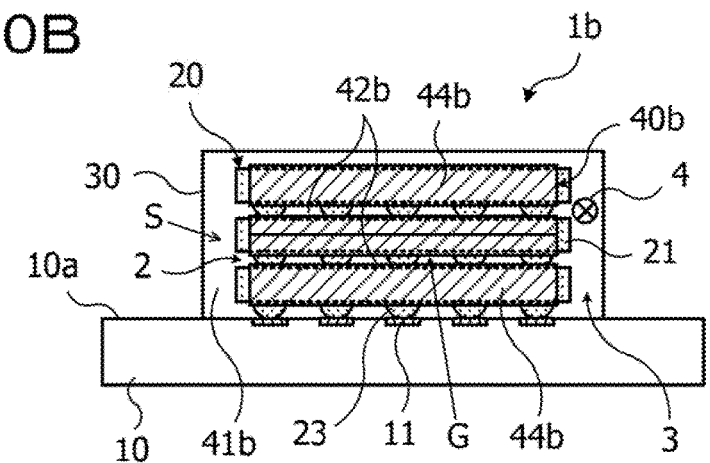
Figure 10C:
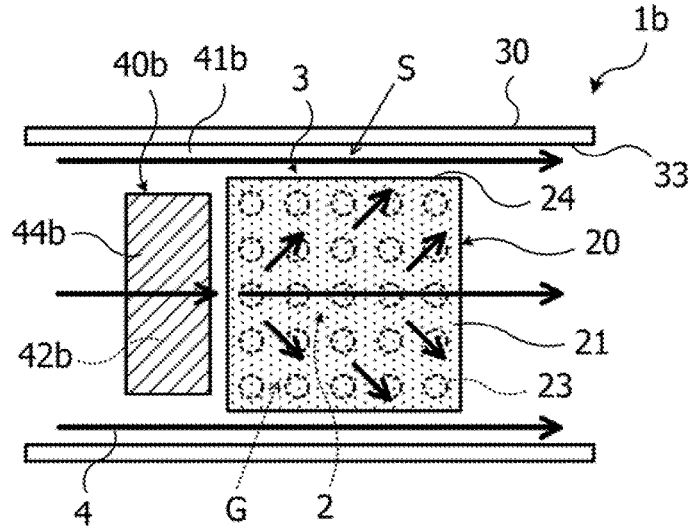

FIGS. 10A to 10C are views illustrating a second modification of a semiconductor module according to the first embodiment. Each of FIGS. 10A and 10B schematically illustrates a section of a main portion of the semiconductor module according to the second modification. FIG. 10A is a schematic sectional view illustrating a main portion along a direction from upstream to downstream of a refrigerant, and FIG. 10B is a schematic sectional view illustrating a main portion along a direction perpendicular to the direction from upstream to downstream of a refrigerant. FIG. 10C is a schematic plan view illustrating a main portion of the semiconductor module according to the second modification. The thick arrows illustrated in FIGS. 10A to 10C schematically illustrate a flow of a refrigerant.

A semiconductor module 1b illustrated in FIGS. 10A to 10C is different from the semiconductor module 1a illustrated in FIGS. 9A to 9C in that a guide unit 40b includes three upper, middle, and lower guides 44b when the semiconductor device 20 is viewed at the upstream of the refrigerant 4.

In the guide unit 40b, the area of a flow path 42b formed between the upper and middle guides 44b is reduced toward the gap G between the upper and middle semiconductor elements 21, in the semiconductor device 20 in which the three semiconductor elements 21 are stacked. Similarly, the area of a flow path 42b formed between the middle and lower guides 44b is reduced toward the gap G between the middle and lower semiconductor elements 21, in the semiconductor device 20. Since the three upper, middle, and lower guides 44b are provided, the refrigerant 4 may more easily flow into the gaps G of the semiconductor device 20.

By adjusting the areas of a flow path 41b and a flow path 42b, the flow rate of the refrigerant 4 flowing through each of the flow path 41b and the flow path 42b may be adjusted. The guide unit 40b may be fixed by fitting protrusions formed in the guide unit 40b in recesses of the side wall 33 or the top wall 34 of the container 30, as in the examples of FIGS. 5A and 5B.

As an example, in each of the semiconductor module 1a and the semiconductor module 1b, the width (the flow path height) between the vertically adjacent guides 44a (44b) ranges from 0.02 mm to 1.0 mm.

Due to the three upper, middle, and lower guides 44b, the refrigerant 4 easily flows into the gaps G of the semiconductor device 20, and then a temperature variation of the semiconductor device 20 being heated according to operations may be suppressed, thereby suppressing the performance degradation, damage, or the like of the semiconductor device 20. Thus, the semiconductor module 1b with a high performance and reliability is realized.

Also, herein, it has been illustrated that the three guides 44b are provided in the stacking direction of the three semiconductor elements 21 of the semiconductor device 20, but the number of the semiconductor elements 21 to be stacked and the number of the guides 44b are not limited to this example. For example, the guides 44b corresponding to the number of the stacked semiconductor elements 21 included in the semiconductor device 20 may be provided in the stacking direction of the semiconductor elements 21 so that the flow paths 42b through which the refrigerant 4 flows toward the respective gaps G are formed.

Next, a second embodiment will be described.

Figure 11A:
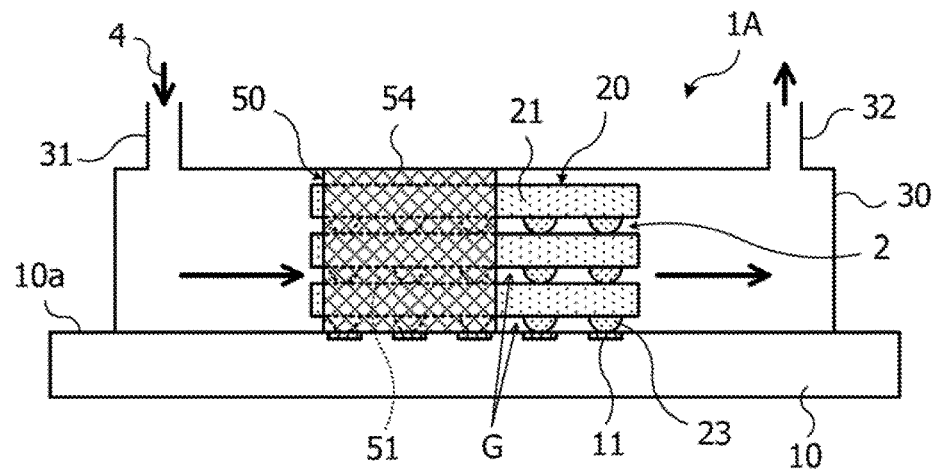
FIGS. 11A to 11C are views illustrating an exemplary semiconductor module according to a second embodiment.
Figure 11B:
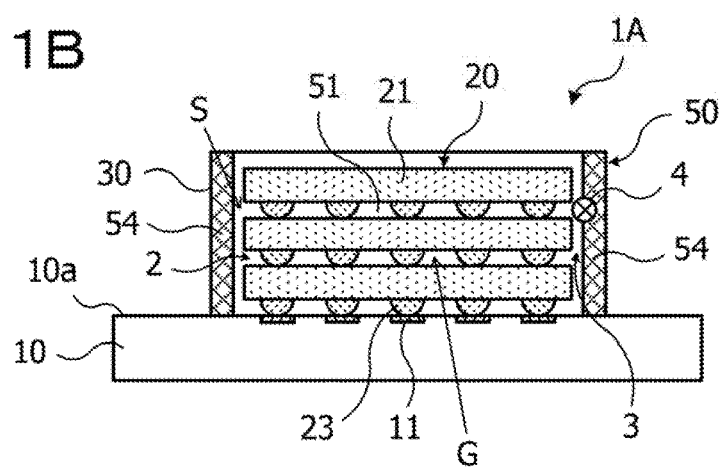
Figure 11C:
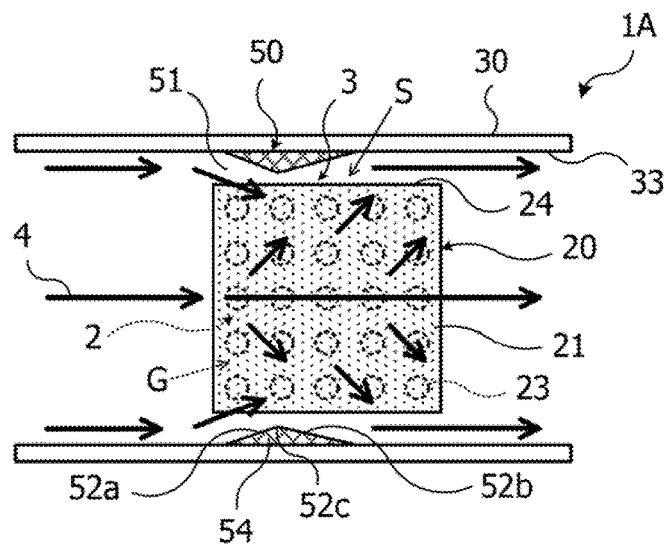

FIGS. 11A to 11C are views illustrating an exemplary semiconductor module according to a second embodiment. Each of FIGS. 11A and 11B schematically illustrates a section of a main portion of the exemplary semiconductor module according to the second embodiment. FIG. 11A is a schematic sectional view illustrating a main portion along a direction from upstream to downstream of a refrigerant, and FIG. 11B is a schematic sectional view illustrating a main portion along a direction perpendicular to the direction from upstream to downstream of a refrigerant. FIG. 11C is a schematic plan view illustrating a main portion of the exemplary semiconductor module according to the second embodiment. The thick arrows illustrated in FIGS. 11A to 11C schematically illustrate a flow of a refrigerant.

A semiconductor module 1A illustrated in FIGS. 11A to 11C includes a circuit board 10, a semiconductor device 20, a container 30, and a guide unit 50 as a guide member.

The guide unit 50 is provided in an external path 3 at a side S of the semiconductor device 20 arranged within the container 30. The guide unit 50 includes a pair of guides 54. In the guide unit 50, a region between the pair of guides 54, that is, a region where the semiconductor device 20 is arranged, corresponds to a flow path 51 of the refrigerant 4. Each guide 54 includes a portion 52a at the supply port 31 side, in which the area of the flow path 51 gradually decreases toward the downstream of the refrigerant 4, and a portion 52b at the discharge port 32 side, in which the area of the flow path 51 gradually increases toward the downstream of the refrigerant 4. The guide 54 is provided spaced apart from a side wall 24 of the semiconductor device 20. For example, the guide 54 is provided to leave a gap in a range of 0.1 mm to 1.0 mm between a boundary 52c between the portion 52a and the portion 52b, and the side wall 24 of the semiconductor device 20.

The guide unit 50 may be formed using various materials such as a metal material, a ceramic material, or a resin material.

In the semiconductor module 1A including the guide unit 50, a flow of the refrigerant 4 supplied from the supply port 31 into the container 30 is collected at the central portion side of the container 30 in which the semiconductor device 20 is arranged, by the upstream portion 52a of the guide 54. Accordingly, the refrigerant 4 is allowed to flow into a gap G between semiconductor elements 21, thereby suppressing a temperature rise at the central portion of the semiconductor device 20 that is being heated according to operations.

Since the guide 54 is spaced apart from the side wall 24 of the semiconductor device 20, the refrigerant 4 at a certain flow rate also flows through the side S of the semiconductor device 20. Accordingly, while an excessive increase of a flow resistance by the guide unit 50 is suppressed, a temperature rise at the end portion of the semiconductor device 20 being heated according to operations is suppressed.

In the semiconductor module 1A, by adjusting the shape and arrangement of the portion 52a and the portion 52b, the flow rate of the refrigerant 4 flowing through the internal path 2 in the gap G of the semiconductor device 20, and the flow rate of the refrigerant 4 flowing through the external path 3 at the side S of the semiconductor device 20 may be adjusted, respectively.

By the guide unit 50 provided within the container 30, a temperature variation and local heating of the semiconductor device 20 may be suppressed when the semiconductor device 20 being heated according to operations is cooled with the refrigerant 4, thereby suppressing the performance degradation, damage, or the like of the semiconductor device 20. Accordingly, the semiconductor module 1A with a high performance and reliability may be realized.

Hereinafter, the guide unit 50 will be further described.

Figure 12A:
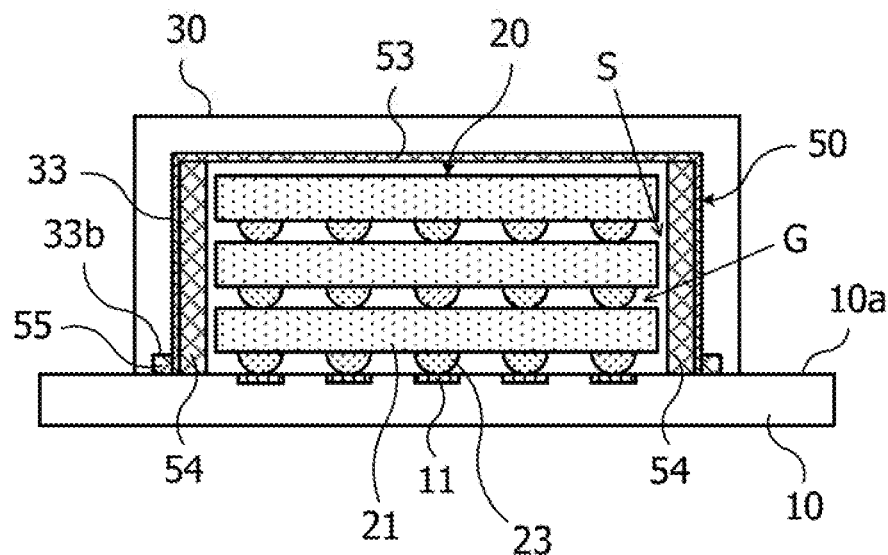
FIGS. 12A and 12B are explanatory views of a method of fixing a guide unit according to the second embodiment.
Figure 12B:
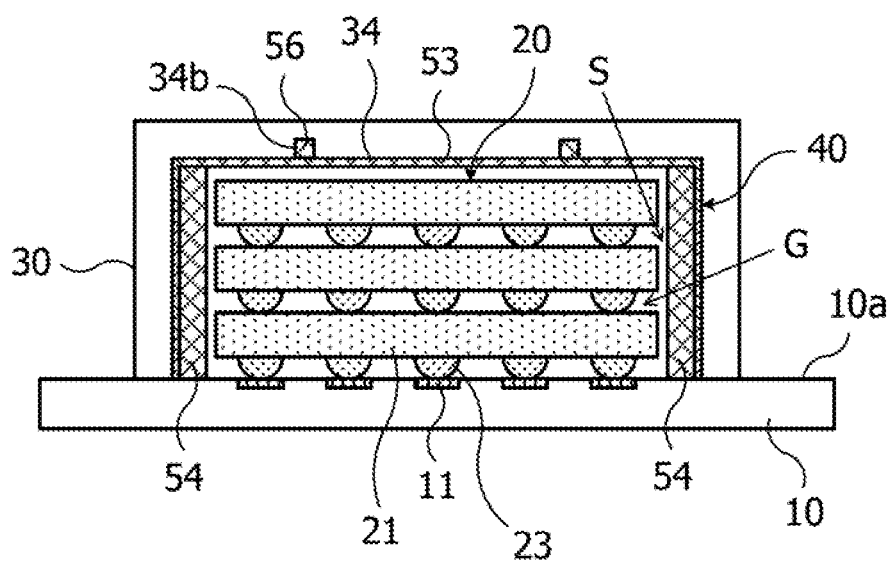

FIGS. 12A and 12B are explanatory views of a method of fixing the guide unit according to the second embodiment. Each of FIGS. 12A and 12B schematically illustrates a section of a main portion of the exemplary semiconductor module according to the second embodiment. FIGS. 12A and 12B are schematic sectional views illustrating a main portion along a direction perpendicular to a direction from upstream to downstream of a refrigerant.

For example, as illustrated in FIG. 12A, the guide unit 50 includes a support 53, a pair of guides 54 provided on the support 53, and protrusions 55 protruding laterally from the support 53. The support 53 comes in contact with the inner surface of the container 30, and the protrusions 55 are fitted in recesses 33b of a side wall 33 of the container 30 such that the guide unit 50 is fixed within the container 30. Here, the guide unit 50 may be bonded to the container 30 using an adhesive.

For example, as illustrated in FIG. 12B, the guide unit 50 includes a support 53, a pair of guides 54 provided on the support 53, and protrusions 56 protruding upwardly from the support 53. The support 53 comes in contact with the inner surface of the container 30, and the protrusions 56 are fitted in recesses 34b of a top wall 34 of the container 30 such that the guide unit 50 is fixed within the container 30. Here, the guide unit 50 may be bonded to the container 30 using an adhesive.

For example, the guide unit 50 may be arranged and fixed within the container 30 using the method described for FIGS. 12A and 12B.

The lower ends of the guides 54 may be in contact with the surface 10a of the circuit board 10 as illustrated in FIGS. 12A and 12B, or may not be in contact with the surface 10a according to the structure (e.g., an arrangement of the electrodes 11 or the wiring pattern) of the surface 10a of the circuit board 10.

Configuration examples of the guide unit 50 and the container 30 are illustrated in FIGS. 13A to 13C to FIGS. 15A and 15B.

Figure 13A:
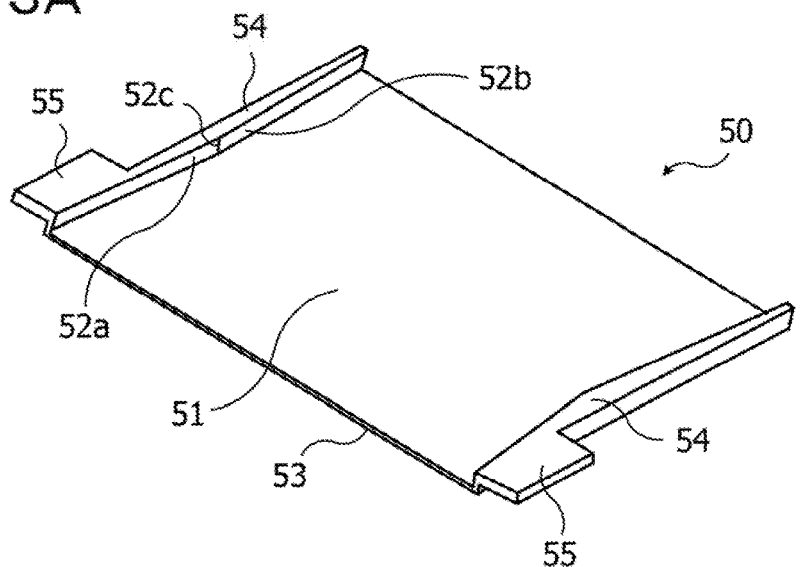
FIGS. 13A to 13C are views illustrating a first configuration example of a guide unit and a container according to the second embodiment.
Figure 13B:
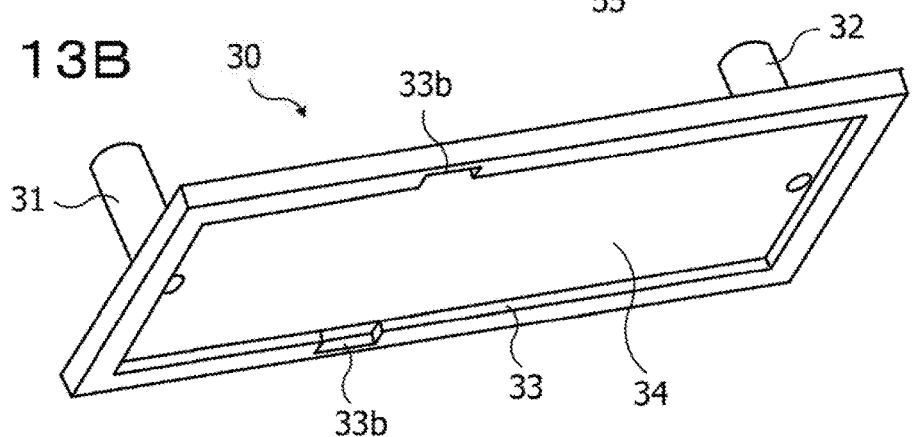
Figure 13C:
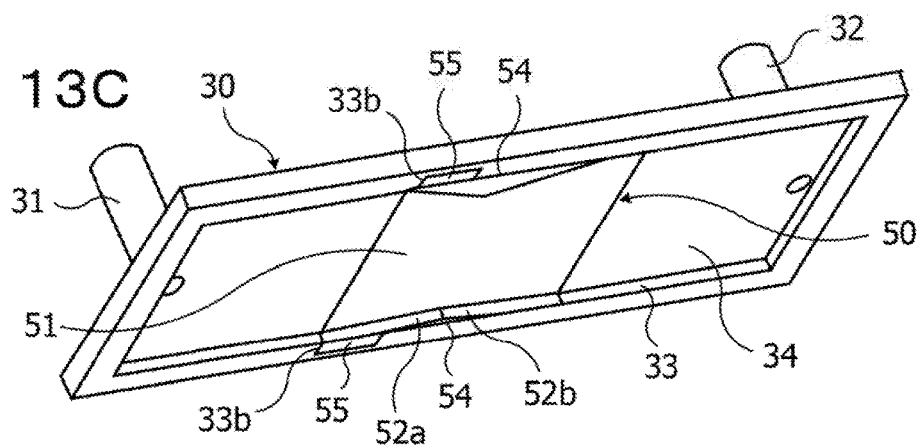

FIGS. 13A to 13C are views illustrating a first configuration example of the guide unit and the container according to the second embodiment. FIG. 13A is a schematic perspective view illustrating the guide unit according to the first configuration example. FIG. 13B is a schematic perspective view illustrating the container according to the first configuration example. FIG. 13C is a schematic perspective view illustrating the guide unit and the container according to the first configuration example.

The guide unit 50 according to the first configuration example, as illustrated in FIG. 13A, includes a support 53, a pair of guides 54, and protrusions 55. A gap between the pair of guides 54 corresponds to a flow path 51 through which the refrigerant 4 flows, and a region in which the semiconductor device 20 (FIGS. 11A to 11C) is arranged. The guide 54 includes a portion 52a and a portion 52b. The portion 52a side corresponds to the supply port 31 side of the container 30, and the portion 52b side corresponds to the discharge port 32 side. In the portion 52a, the area of the flow path 51 gradually decreases toward the downstream of the refrigerant 4, and in the portion 52b, the area of the flow path 51 gradually increases toward the downstream of the refrigerant 4. The guide unit 50 according to the first configuration example corresponds to the guide unit 50 of FIG. 12A.

The container 30 according to the first configuration example, as illustrated in FIG. 13B, includes a top wall 34, a side wall 33, and a supply port 31 and a discharge port 32 of the refrigerant 4. Recesses 33b in which the protrusions 55 of the guide unit 50 are fitted are formed at the side wall 33 of the container 30 in an arrangement region of the semiconductor device 20.

As illustrated in FIG. 13C, at the inside surrounded by the top wall 34 and the side wall 33 of the container 30, the guide unit 50 is provided by fitting the protrusions 55 in the recesses 33b. The guide unit 50 may be bonded to the container 30 using an adhesive.

Figure 14A:
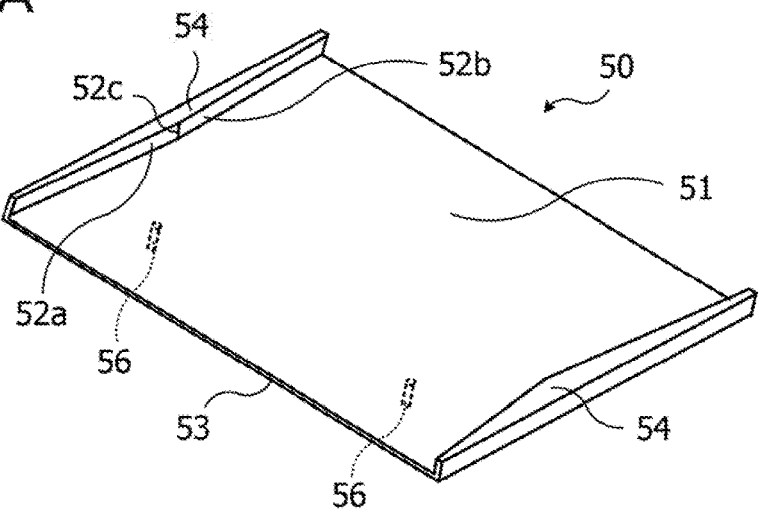
FIGS. 14A to 14C are views illustrating a second configuration example of a guide unit and a container according to the second embodiment.
Figure 14B:
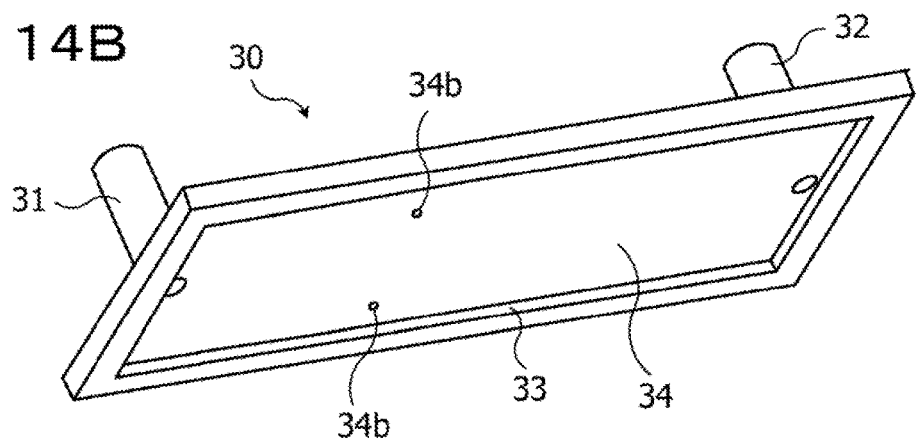
Figure 14C:
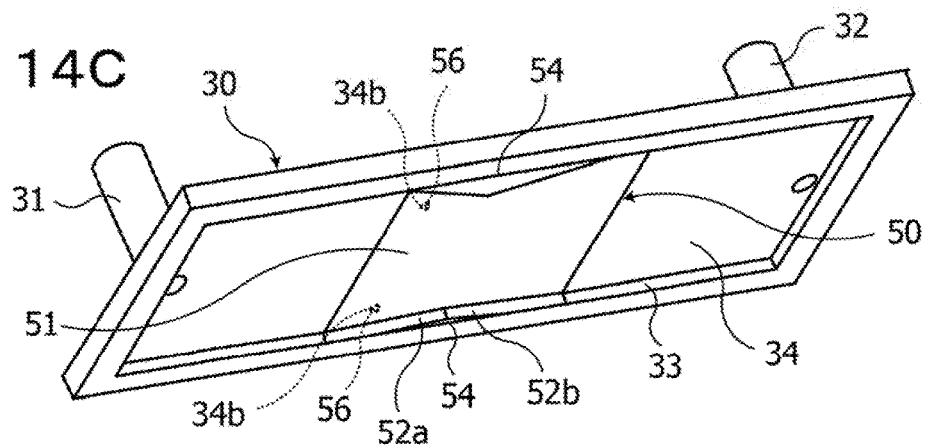

FIGS. 14A to 14C are views illustrating a second configuration example of the guide unit and the container according to the second embodiment. FIG. 14A is a schematic perspective view illustrating the guide unit according to the second configuration example. FIG. 14B is a schematic perspective view illustrating the container according to the second configuration example. FIG. 14C is a schematic perspective view illustrating the guide unit and the container according to the second configuration example.

The guide unit 50 according to the second configuration example, as illustrated in FIG. 14A, includes a support 53, a pair of guides 54 provided on one surface of the support 53, and protrusions 56 formed on the other surface of the support 53. The guide unit 50 according to the second configuration example corresponds to the guide unit 50 of FIG. 12B.

The container 30 according to the second configuration example, as illustrated in FIG. 14B, includes a top wall 34, a side wall 33, and a supply port 31 and a discharge port 32 of the refrigerant 4. Recesses 34b in which the protrusions 56 of the guide unit 50 are fitted are formed at the top wall 34 of the container 30 in the arrangement region of the semiconductor device 20.

As illustrated in FIG. 14C, at the inside surrounded by the top wall 34 and the side wall 33 of the container 30, the guide unit 50 is provided by fitting the protrusions 56 in the recesses 34b. The guide unit 50 may be bonded to the container 30 using an adhesive.

Figure 15A:
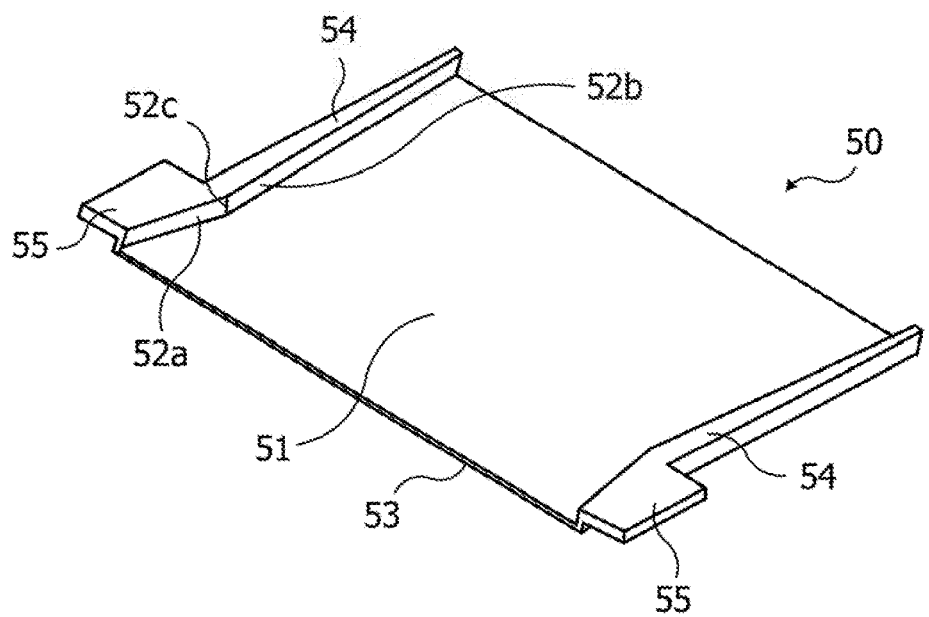
FIGS. 15A and 15B are views illustrating third and fourth configuration examples of a guide unit according to the second embodiment.
Figure 15B:
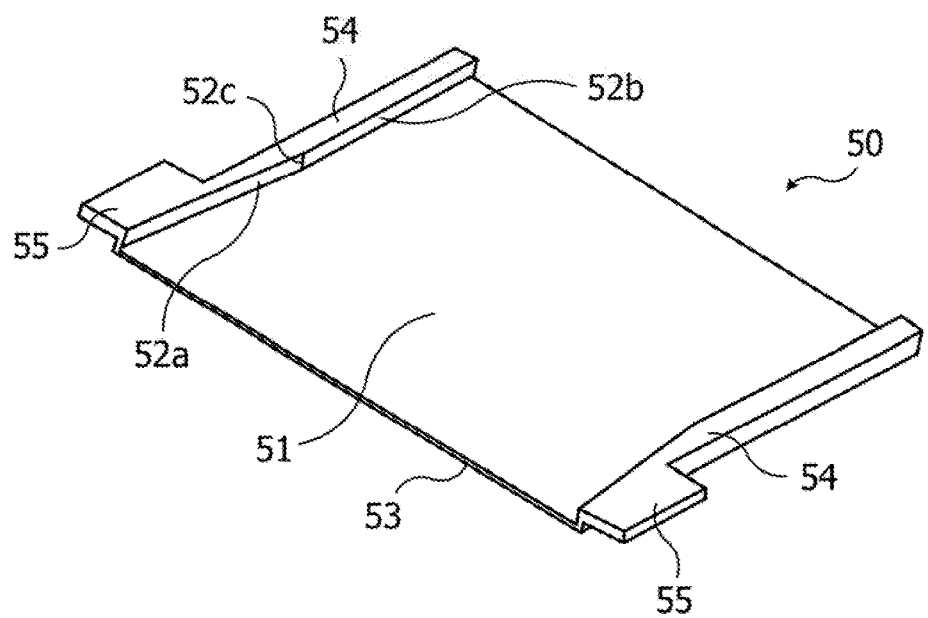

FIGS. 15A and 15B are views illustrating third and fourth configuration examples of a guide unit according to the second embodiment. FIG. 15A is a schematic perspective view illustrating a guide unit according to the third configuration example. FIG. 15B is a schematic perspective view illustrating a guide unit according to the fourth configuration example.

As illustrated in FIG. 15A, the guide unit 50 according to the third configuration example is different from the guide unit 50 according to the first configuration example as illustrated in FIG. 13A in that a boundary 52c between a portion 52a and a portion 52b of a guide 54 is located nearer to the supply port 31 of the container 30.

The guide unit 50 illustrated in FIG. 15A is provided in the container 30 as illustrated in FIG. 13B, in the manner as illustrated in FIG. 13C. When the location of the boundary 52c between the portion 52a and the portion 52b of the guide 54 is shifted, the flow of the refrigerant 4 within the flow path 51 is changed from the flow in the guide unit 50 according to the first configuration example illustrated in FIG. 13A. As a result, when the refrigerant 4 collides with the semiconductor device 20, a change is caused in the collision manner of the refrigerant 4, the flow velocity of the refrigerant 4 or the like. Using this, the flow rate of the refrigerant 4 flowing through each of the internal path 2 and the external path 3 in the semiconductor module 1A may be adjusted.

The guide unit 50 according to the fourth configuration example, as illustrated in FIG. 15B, is different from the guide unit 50 according to the first configuration example as illustrated in FIG. 13A in that the guide unit 50 includes a guide 54 having a portion 52b by which the area of the flow path 51 is constant toward the downstream of the refrigerant 4.

Even when the portion 52b illustrated in FIG. 15B is employed, the flow of the refrigerant 4 within the flow path 51 may be changed, thereby adjusting the flow rate of the refrigerant 4 flowing through the internal path 2 and the external path 3 in the semiconductor module 1A. Also, in a case where the portion 52b illustrated in FIG. 15B is employed, the location of a boundary 52c between a portion 52a and the portion 52b may be shifted in order to adjust the flow rate of the refrigerant 4 flowing through the internal path 2 and the external path 3 in the semiconductor module 1A.

The guide unit 50 may employ different configurations in a pair of guides 54. For example, one guide 54 and the other guide 54 may be different in the location of a boundary 52c between the portion 52a and the portion 52b. Also, one guide 54 may be formed with the portion 52a and the portion 52b as described above, but the other guide 54 may not be formed with the portion 52a and the portion 52b as described above (to form a straight flow path).

Next, a third embodiment will be described.

Figure 16A:
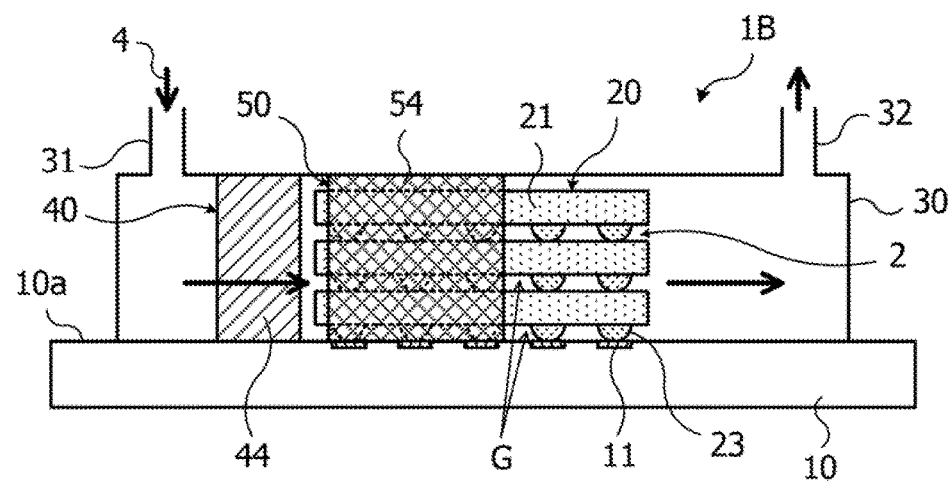
FIGS. 16A to 16C are views illustrating an exemplary semiconductor module according to a third embodiment.
Figure 16B:
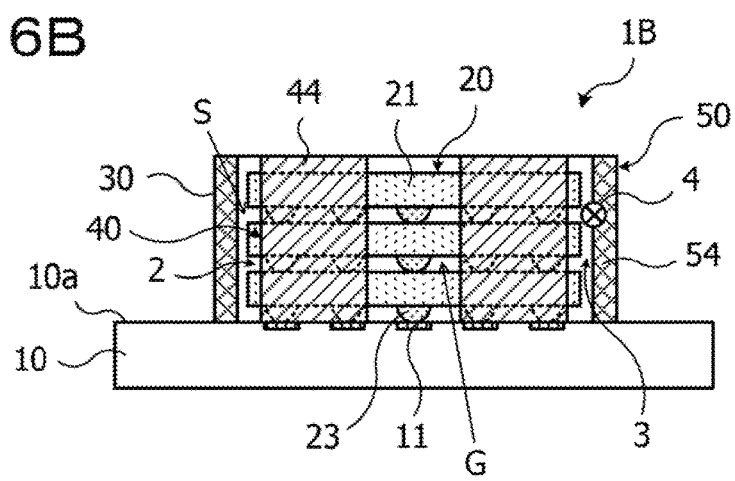
Figure 16C:
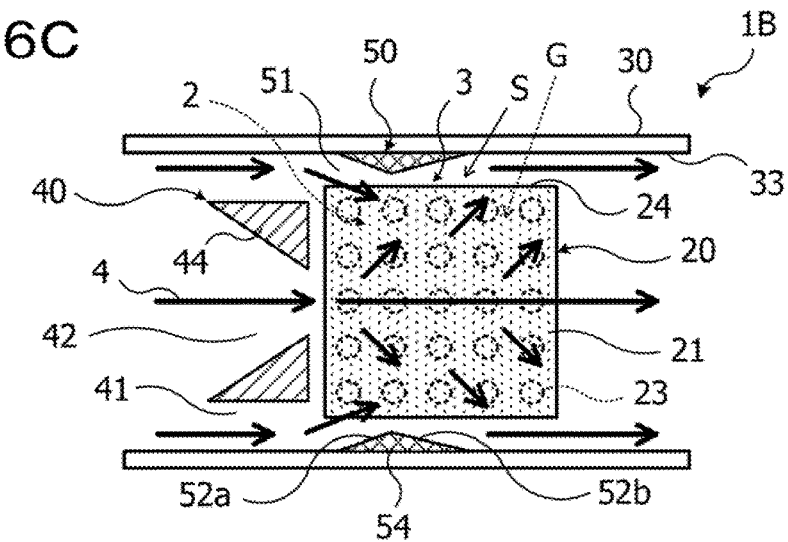

FIGS. 16A to 16C are views illustrating an exemplary semiconductor module according to a third embodiment. Each of FIGS. 16A and 16B schematically illustrates a section of a main portion of the exemplary semiconductor module according to the third embodiment. FIG. 16A is a schematic sectional view illustrating a main portion along a direction from upstream to downstream of a refrigerant, and FIG. 16B is a schematic sectional view illustrating a main portion along a direction perpendicular to the direction from upstream to downstream of a refrigerant. FIG. 16C is a schematic plan view illustrating a main portion of the exemplary semiconductor module according to the third embodiment. The thick arrows illustrated in FIGS. 16A to 16C schematically illustrate a flow of a refrigerant.

A semiconductor module 1B illustrated in FIGS. 16A to 16C includes a circuit board 10, a semiconductor device 20, a container 30, a guide unit 40 described in the first embodiment, and a guide unit 50 described in the second embodiment. The semiconductor module 1B includes the guide unit 40 and the guide unit 50 as guide members as described above.

In the semiconductor module 1B including the guide unit 40 and the guide unit 50, the refrigerant 4 supplied from a supply port 31 into the container 30 firstly diverges into a flow path 41 at a side wall 33 side of the container 30, and a flow path 42 at the inner side of the flow path 41 by a guide 44 of the guide unit 40 at the upstream.

The refrigerant 4 flowing through the flow path 42 at the inner side collides with the semiconductor device 20 at an increasing flow velocity and flows into a gap G, because the flow path 42 becomes narrower toward the semiconductor device 20. The refrigerant 4 flowing through the flow path 41 at the outer side collides with a guide 54 of the guide unit 50, i.e., a portion 52a at the upstream, is deflected to the semiconductor device 20 side, and flows into the gap G. Since the guide 54 is spaced apart from the semiconductor device 20, the refrigerant 4 also flows to a discharge port 32 side through a side S of the semiconductor device 20.

Within the gap G of the semiconductor device 20, the refrigerant 4 flowing from the flow path 42 of the guide unit 40 collides with the refrigerant 4 flowing into the gap G after clashing with the portion 52a of the guide unit 50. Then, the flow of the refrigerant 4 is disturbed within the gap G so that the refrigerant 4 flows in a wide range within the gap G. One part of the refrigerant 4 flows to the discharge port 32 side, and another part flows to the side wall 33 side of the container 30 along a portion 52b of the guide unit 50, and then to the discharge port 32 side.

By the shape and arrangement of the guide unit 40 and the guide unit 50, the flow rate of the refrigerant 4 flowing through an internal path 2 in the gap G of the semiconductor device 20, and the flow rate of the refrigerant 4 flowing through an external path 3 at the side S of the semiconductor device 20 may be adjusted, respectively.

By the guide unit 40 and the guide unit 50, the refrigerant 4 supplied from the supply port 31 into the container 30 flows through both the gap G and the side S of the semiconductor device 20. By the refrigerant 4 flowing through both the gap G and the side S, the central portion and the end portion of the semiconductor device 20 are cooled. Accordingly, a temperature variation and local heating of the semiconductor device 20 may be suppressed, thereby suppressing the performance degradation, damage, or the like of the semiconductor device 20. Thus, the semiconductor module 1B with a high performance and reliability is realized.

Figure 17:
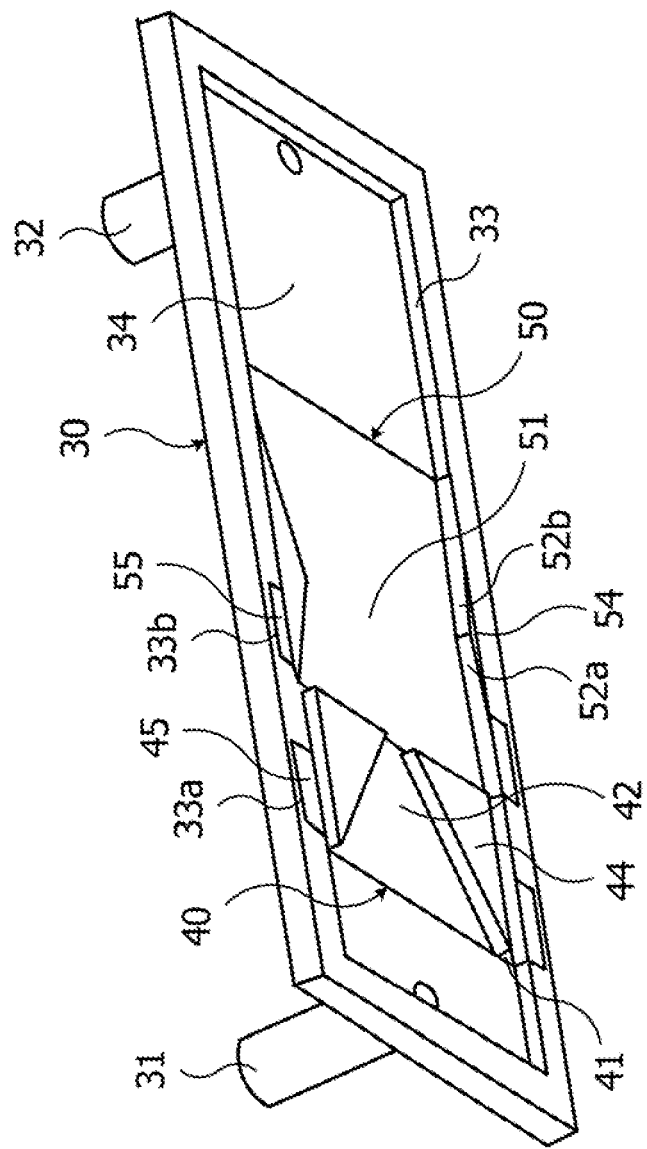
FIG. 17 is a view illustrating a configuration example of a guide unit and a container according to the third embodiment.

FIG. 17 is a view illustrating a configuration example of the guide unit and the container according to the third embodiment. FIG. 17 is a schematic perspective view illustrating the guide unit and the container.

For example, the guide unit 40 including the support 43, the guides 44, and the protrusions 45 as illustrated in FIG. 6A, and the guide unit 50 including the support 53, the guides 54 and the protrusions 55 as illustrated in FIG. 13A are provided in the container 30 as illustrated in FIG. 17. For example, the container 30 includes recesses 33a and recesses 33b in the side wall 33 thereof. The guide unit 40 is provided in the container 30 by fitting the protrusions 45 in the recesses 33a of the container 30. The guide unit 50 is provided in the container 30 by fitting the protrusions 55 in the recesses 33b of the container 30.

Figure 18:
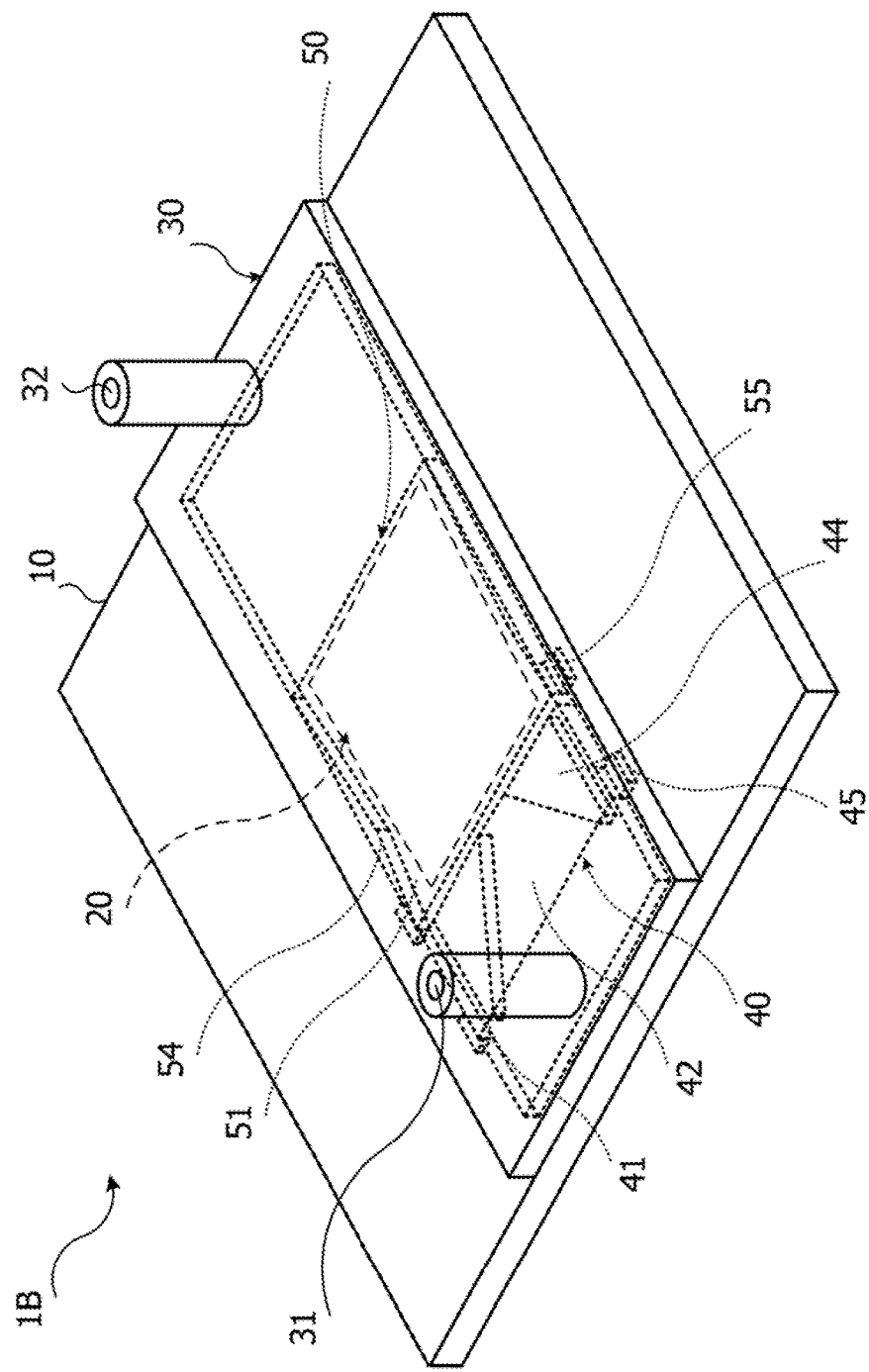
FIG. 18 is a view illustrating a configuration example of a semiconductor module according to the third embodiment.

FIG. 18 is a view illustrating a configuration example of the semiconductor module according to the third embodiment. FIG. 18 is a schematic perspective view illustrating the semiconductor module.

For example, the container 30 provided with the guide unit 40 and the guide unit 50 as illustrated in FIG. 17 is provided on the circuit board 10 mounted with the semiconductor device 20 to cover the semiconductor device 20. The guide unit 40 is provided at the upstream of the semiconductor device 20, and the guide unit 50 is provided at the arrangement region of the semiconductor device 20.

Without being limited to the configurations of FIGS. 17 and 18, the guide unit 40 may employ guide units illustrated in FIGS. 7A and 8, and the guide unit 50 may employ guide units illustrated in FIGS. 14A, 15A, and 15B. In this case, according to the configuration (e.g., protrusions) of the guide unit 40 and the guide unit 50 to be used, the configuration (e.g., recesses) of the container 30 in which the guide units are fixed is changed.

The guide unit 40 and the guide unit 50 may be formed as separate parts, or may be formed as one integrated part.

Next, a fourth embodiment will be described.

Figure 19A:
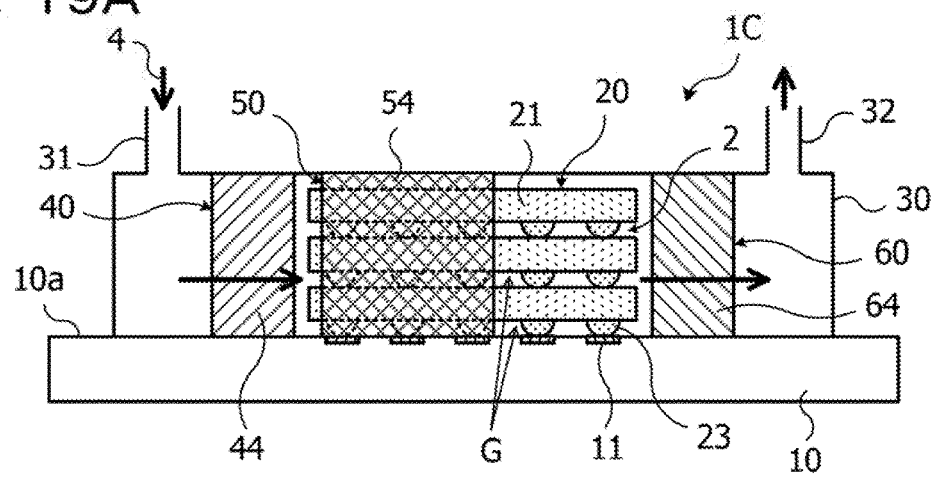
FIGS. 19A to 19C are views illustrating an exemplary semiconductor module according to a fourth embodiment.
Figure 19B:
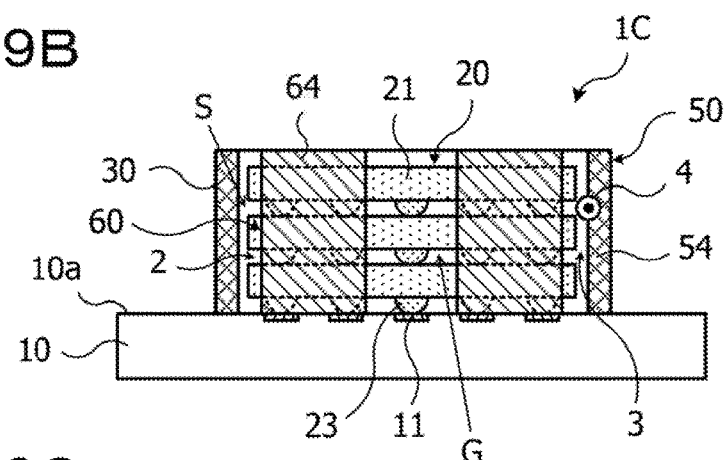
Figure 19C:
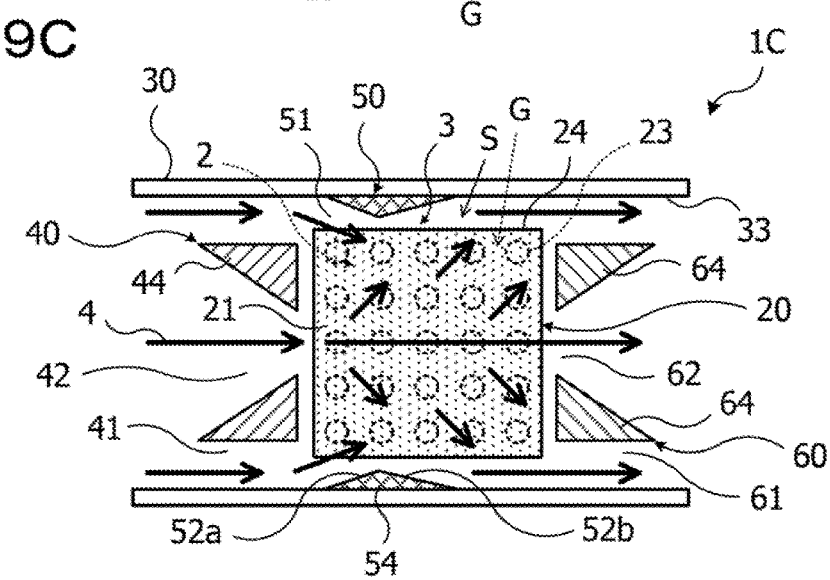

FIGS. 19A to 19C are views illustrating an exemplary semiconductor module according to a fourth embodiment. Each of FIGS. 19A and 19B schematically illustrates a section of a main portion of the exemplary semiconductor module according to the fourth embodiment. FIG. 19A is a schematic sectional view illustrating a main portion along a direction from upstream to downstream of a refrigerant, and FIG. 19B is a schematic sectional view illustrating a main portion along a direction perpendicular to the direction from upstream to downstream of a refrigerant. FIG. 19C is a schematic plan view illustrating a main portion of the exemplary semiconductor module according to the fourth embodiment. The thick arrows illustrated in FIGS. 19A to 19C schematically illustrate a flow of a refrigerant.

A semiconductor module 1C illustrated in FIGS. 19A to 19C is different from the semiconductor module 1B according to the third embodiment in that a guide unit 60 is further provided at the downstream of a semiconductor device 20 arranged within a container 30. The semiconductor module 1C includes a guide unit 40, a guide unit 60, and the guide unit 60, as guide members as described above.

The guide unit 60 includes a pair of guides 64. A flow path 62 is formed between the pair of guides 64, and flow paths 61 are formed outside the pair of guides 64. The flow path 62 becomes narrower toward the semiconductor device 20 to be communicated with an internal path 2 in a gap G of the semiconductor device 20. The flow path 61 is communicated with an external path 3 at a side S of the semiconductor device 20.

The guide unit 60 may be formed using various materials such as a metal material, a ceramic material, or a resin material.

In the semiconductor module 1C in which besides the guide unit 40 and the guide unit 50, the guide unit 60 is further provided, as described above, the refrigerant 4 flows into the gap G of the semiconductor device 20 by the guide unit 40 and the guide unit 50. Then, in the semiconductor module 1C, since the flow path 62 is narrowed by the guide unit 60, the flow velocity of the refrigerant 4 flowing through the corresponding region is increased. Accordingly, the discharge of the refrigerant 4 from the gap G of the semiconductor device 20 is facilitated, so that the refrigerant 4 discharged from the semiconductor device 20 and the refrigerant 4 flowing through the side S of the semiconductor device 20 efficiently flow to a discharge port 32 side. The refrigerant 4 flowing into the gap G sufficiently spreads to downstream corner portions of the semiconductor device 20 due to the presence (resistance) of the guide unit 60. By providing the guide unit 60, the cooling effect of the semiconductor device 20 may be improved.

By the shape and arrangement of the guide unit 60 as well as the guide unit 40 and the guide unit 50, the flow rate of the refrigerant 4 flowing through the internal path 2 in the gap G of the semiconductor device 20, and the flow rate of the refrigerant 4 flowing through the external path 3 at the side S of the semiconductor device 20 may be adjusted, respectively.

According to the semiconductor module 1C, a temperature variation and local heating of the semiconductor device 20 may be suppressed, thereby suppressing the performance degradation, damage, or the like of the semiconductor device 20. Thus, the semiconductor module 1C with a high performance and reliability is realized.

Figure 20A:
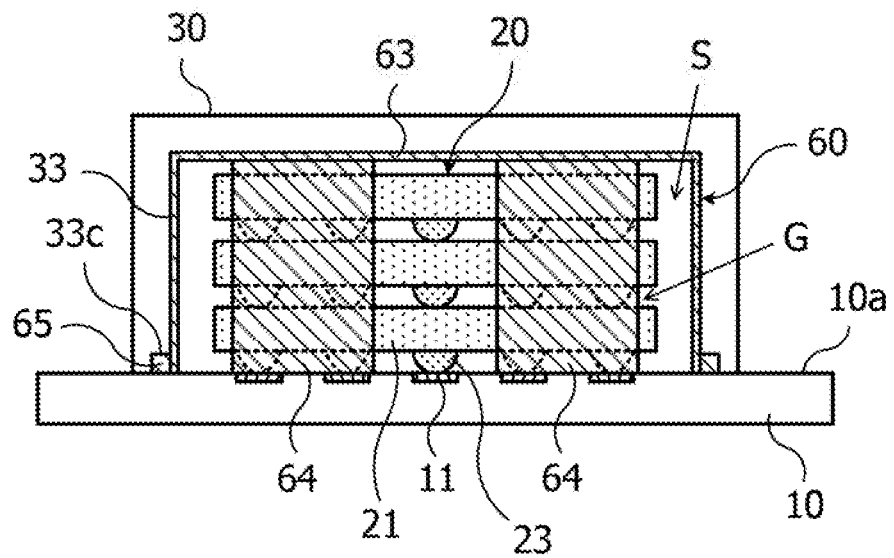
FIGS. 20A and 20B are explanatory views of a method of fixing a guide unit according to the fourth embodiment.
Figure 20B:
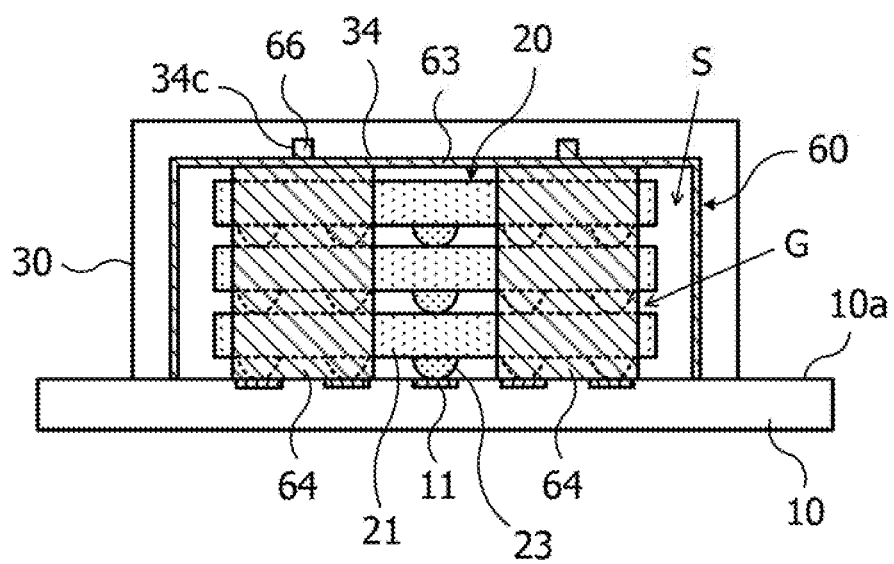

FIGS. 20A and 20B are explanatory views of a method of fixing the guide unit according to the fourth embodiment. Each of FIGS. 20A and 20B schematically illustrates a section of a main portion of the exemplary semiconductor module according to the fourth embodiment. FIGS. 20A and 20B are schematic sectional views illustrating a main portion along a direction perpendicular to a direction from upstream to downstream of a refrigerant.

For example, as illustrated in FIG. 20A, the guide unit 60 includes a support 63, a pair of guides 64 provided on the support 63, and protrusions 65 protruding laterally from the support 63. The support 63 comes in contact with the inner surface of the container 30, and the protrusions 65 are fitted in recesses 33c of a side wall 33 of the container 30 such that the guide unit 60 is fixed within the container 30. Here, the guide unit 60 may be bonded to the container 30 using an adhesive.

For example, as illustrated in FIG. 20B, the guide unit 60 includes a support 63, a pair of guides 64 provided on the support 63, and protrusions 66 protruding upwardly from the support 63. The support 63 comes in contact with the inner surface of the container 30, and the protrusions 66 are fitted in recesses 34c of a top wall 34 of the container 30 such that the guide unit 60 is fixed within the container 30. Here, the guide unit 60 may be bonded to the container 30 using an adhesive.

For example, the guide unit 60 may be arranged and fixed within the container 30 using the method described for FIGS. 20A and 20B.

The lower ends of the guides 64 may be in contact with the surface 10a of the circuit board 10 as illustrated in FIGS. 20A and 20B, or may not be in contact with the surface 10a according to the structure (e.g., an arrangement of the electrodes 11 or the wiring pattern) of the surface 10a of the circuit board 10.

Figure 21A:
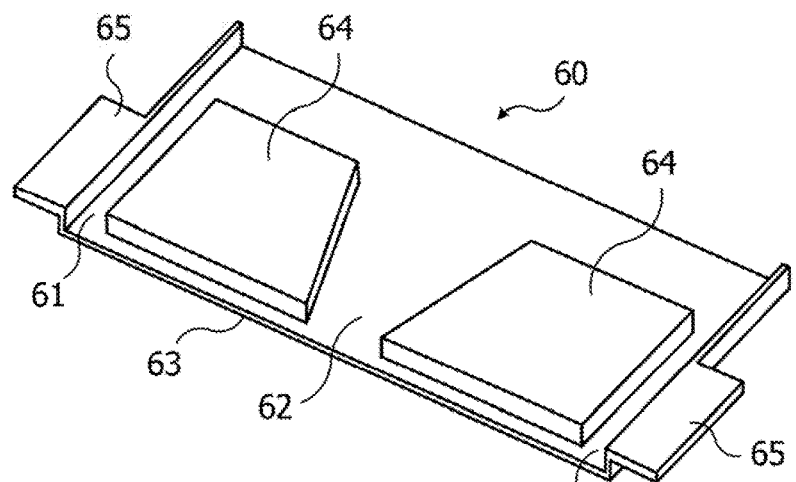
FIGS. 21A to 21C are views illustrating configuration examples of a guide unit according to the fourth embodiment.
Figure 21B:
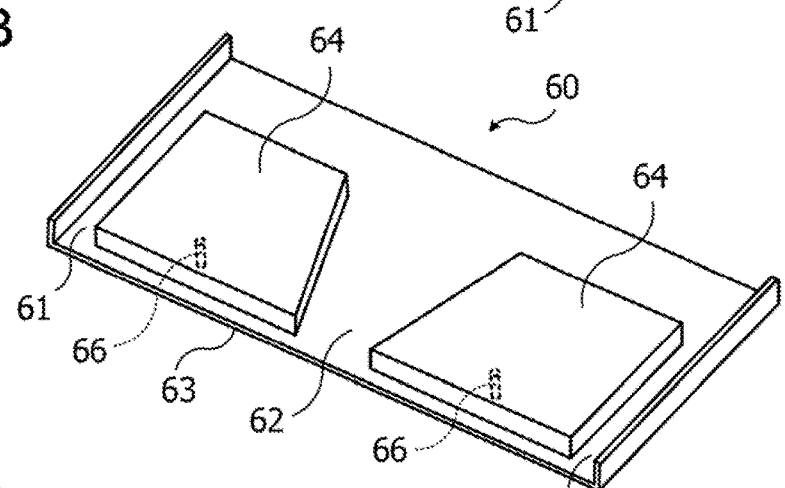
Figure 21C:
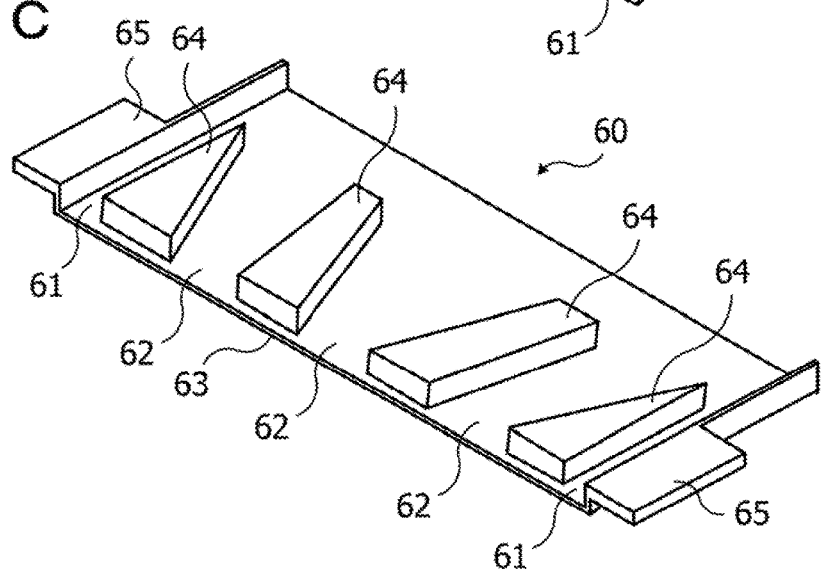

FIGS. 21A to 21C are views illustrating configuration examples of a guide unit according to the fourth embodiment. FIG. 21A is a schematic perspective view illustrating a guide unit according to a first configuration example. FIG. 21B is a schematic perspective view illustrating a guide unit according to a second configuration example. FIG. 21C is a schematic perspective view illustrating a guide unit according to a third configuration example.

As illustrated in FIG. 21A, the guide unit 60 according to the first configuration example includes a support 63, a pair of guides 64, and protrusions 65. A narrower width between the pair of guides 64 corresponds to a side of the semiconductor device 20 (FIGS. 19A to 19C) arranged within a container 30. A gap between the pair of guides 64 forms the flow path 62, and the outside of the pair of guides 64 forms the flow paths 61. The flow path 62 is reduced in the flow passage area toward the semiconductor device 20 side, and the flow path 61 is constant in the flow passage area. The guide unit 60 according to the first configuration example corresponds to the guide unit 60 of FIG. 20A.

As illustrated in FIG. 21B, the guide unit 60 according to the second configuration example includes a support 63, a pair of guides 64 provided on one surface of the support 63, and protrusions 66 formed on the other surface of the support 63. The guide unit 60 according to the second configuration example corresponds to the guide unit 60 of FIG. 20B.

As illustrated in FIG. 21C, the guide unit 60 according to the third configuration example is different from the guide unit 60 according to the first configuration example in that the guide unit 60 includes four guides 64. When the number of guides 64 is four as described above, an increase of a resistance caused by the guides 64 themselves may be suppressed. In the described example, the number of the guides 64 is four, but the number of the guides 64 is not limited to four.

Figure 22:
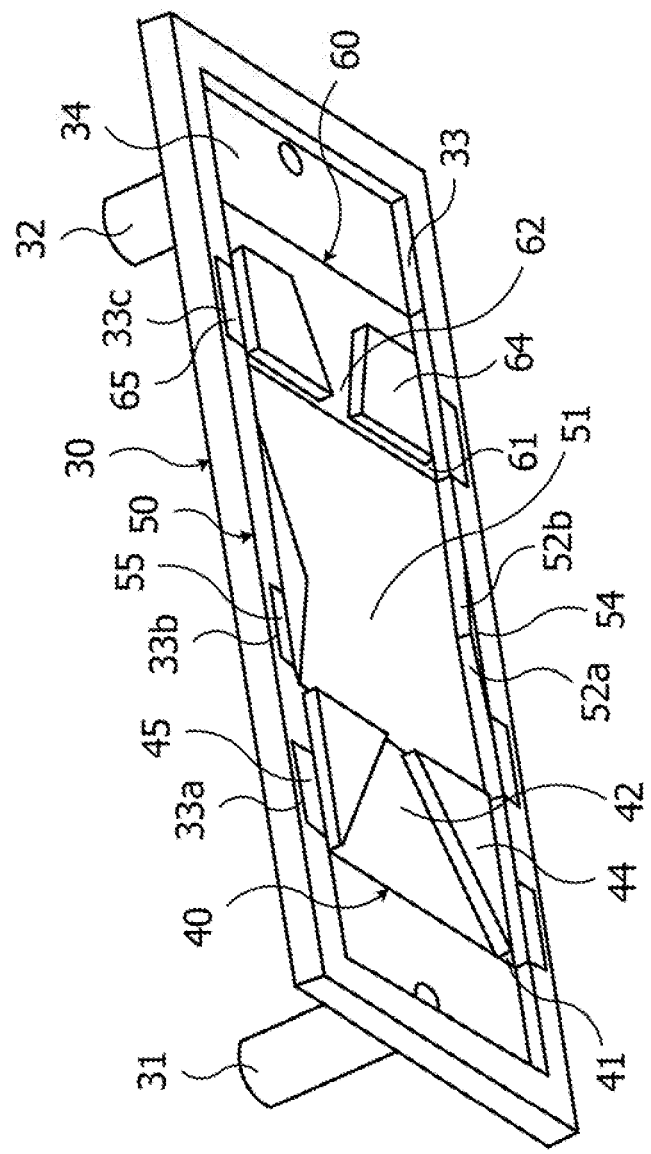
FIG. 22 is a view illustrating a configuration example of a guide unit and a container according to the fourth embodiment.

FIG. 22 is a view illustrating a configuration example of the guide unit and the container according to the fourth embodiment. FIG. 22 is a schematic perspective view illustrating the guide unit and the container.

As illustrated in FIG. 22, for example, the guide unit 60 illustrated in FIG. 21A is further provided in the container 30 provided with the guide unit 40 and the guide unit 50 as illustrated in FIG. 17. In this case, the container 30 includes the recesses 33c in the side wall 33 thereof, and the guide unit 60 is provided in the container 30 by fitting the protrusions 65 in the recesses 33c of the container 30.

FIG. 23 is a view illustrating a configuration example of the semiconductor module according to the fourth embodiment. FIG. 23 is a schematic perspective view illustrating the semiconductor module.

For example, the container 30 provided with the guide unit 40, the guide unit 40, and the guide unit 60 as illustrated in FIG. 22 is provided on the circuit board 10 mounted with the semiconductor device 20 so as to cover the semiconductor device 20. The guide unit 40 is provided at the upstream of the semiconductor device 20, the guide unit 50 is provided at the arrangement region of the semiconductor device 20, and the guide unit 60 is provided at the downstream of the semiconductor device 20. By covering the semiconductor device 20 on the circuit board 10 by the container 30 provided with the guide unit 40, the guide unit 50 and the guide unit 60, the semiconductor module 1C is realized in which a sufficient cooling effect of the semiconductor device 20 is obtained.

Without being limited to the configurations of FIGS. 22 and 23, the guide unit 40 may employ guide units illustrated in FIGS. 7A and 8, and the guide unit 50 may employ guide units illustrated in FIGS. 14A, 15A and 15B. The guide unit 60 may employ guide units illustrated in FIGS. 21B and 21C. In this case, according to the configuration (e.g., protrusions) of the guide unit 40, the guide unit 50, and the guide unit 60 to be used, the configuration (e.g., recesses) of the container 30 in which the guide units are fixed is changed.

The guide unit 40, the guide unit 50, and the guide unit 60 may be formed as separate parts, or may be formed as one integrated part.

Meanwhile, when the flow rate of each of the internal path 2 and the external path 3 is adjustable by the guide unit 60 alone according to the shape and arrangement of the guide unit 60 provided at the downstream of the semiconductor device 20, only the guide unit 60 may be provided as the guide member without the guide unit 40 and the guide unit 50.

Next, a fifth embodiment will be described.

Figure 24A:
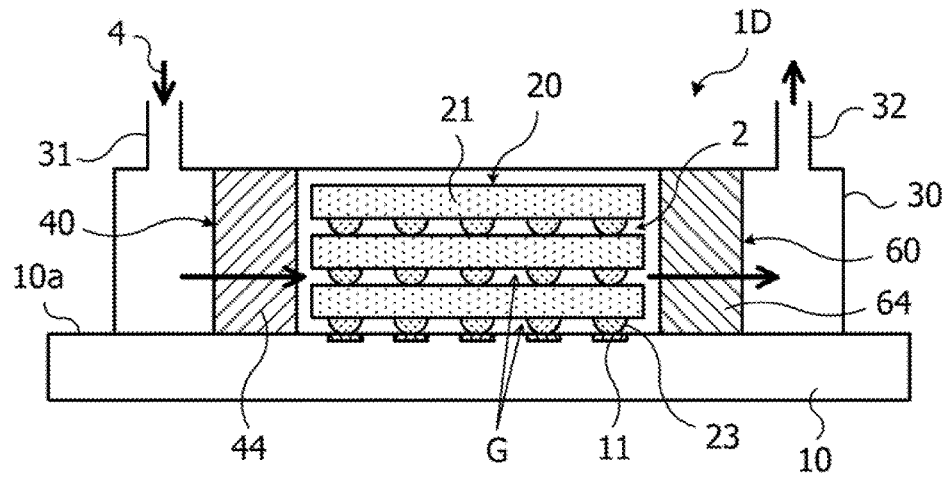
FIGS. 24A to 24C are views illustrating an exemplary semiconductor module according to a fifth embodiment.
Figure 24B:
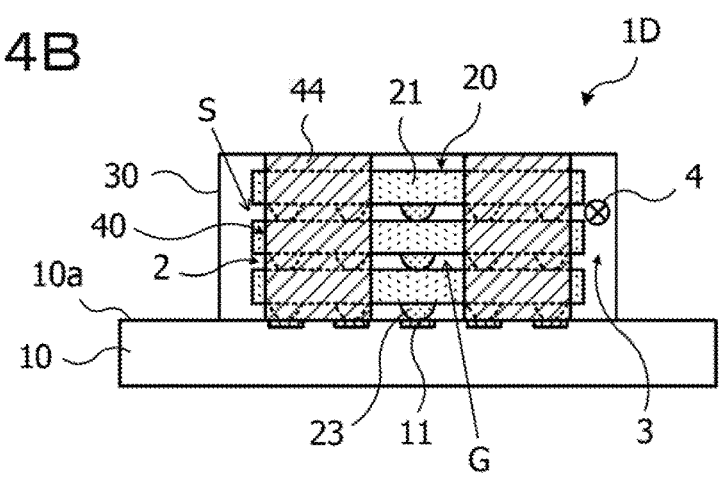
Figure 24C:
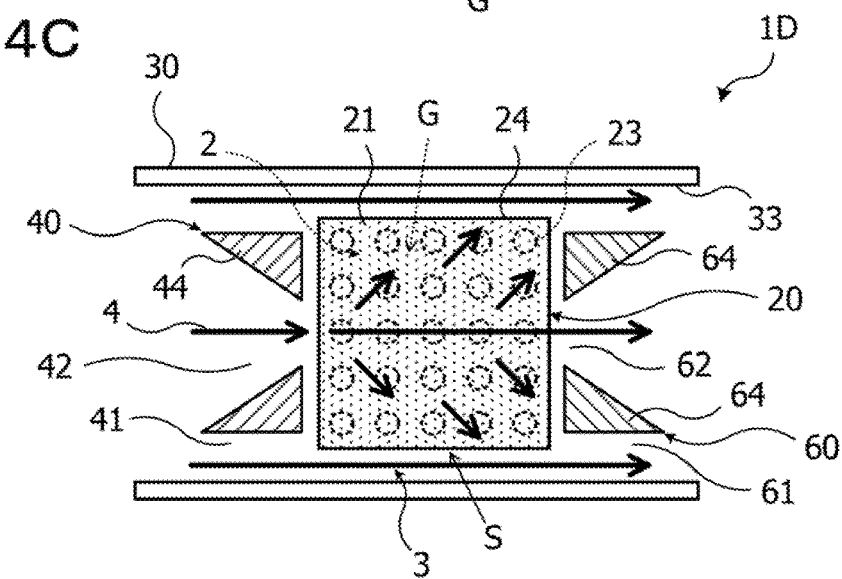

FIGS. 24A to 24C are views illustrating an exemplary semiconductor module according to a fifth embodiment. Each of FIGS. 24A and 24B schematically illustrates a section of a main portion of the exemplary semiconductor module according to the fifth embodiment. FIG. 24A is a schematic sectional view illustrating a main portion along a direction from upstream to downstream of a refrigerant, and FIG. 24B is a schematic sectional view illustrating a main portion along a direction perpendicular to the direction from upstream to downstream of a refrigerant. FIG. 24C is a schematic plan view illustrating a main portion of the exemplary semiconductor module according to the fifth embodiment. The thick arrows illustrated in FIGS. 24A to 24C schematically illustrate a flow of a refrigerant.

A semiconductor module 1D illustrated in FIGS. 24A to 24C is different from the semiconductor module 1C according to the fourth embodiment in that a guide unit 50 is not provided at the midstream, that is, at the arrangement region of a semiconductor device 20. That is, the semiconductor module 1D includes a guide unit 40 and a guide unit 60 as guide members. As described above, a configuration in which the guide unit 40 is provided at the upstream of the semiconductor device 20 within a container 30, and the guide unit 60 is provided at the downstream may be employed.

In the semiconductor module 1D, as described above, the refrigerant 4 flows to both a gap G and a side S of the semiconductor device 20 by the guide unit 40, and then a cooling effect of the semiconductor device 20 may be improved by the guide unit 60. Accordingly, a temperature variation and local heating of the semiconductor device 20 may be suppressed, thereby suppressing the performance degradation, damage, or the like of the semiconductor device 20. Thus, the semiconductor module 1D with a high performance and reliability is realized.

Figure 25A:
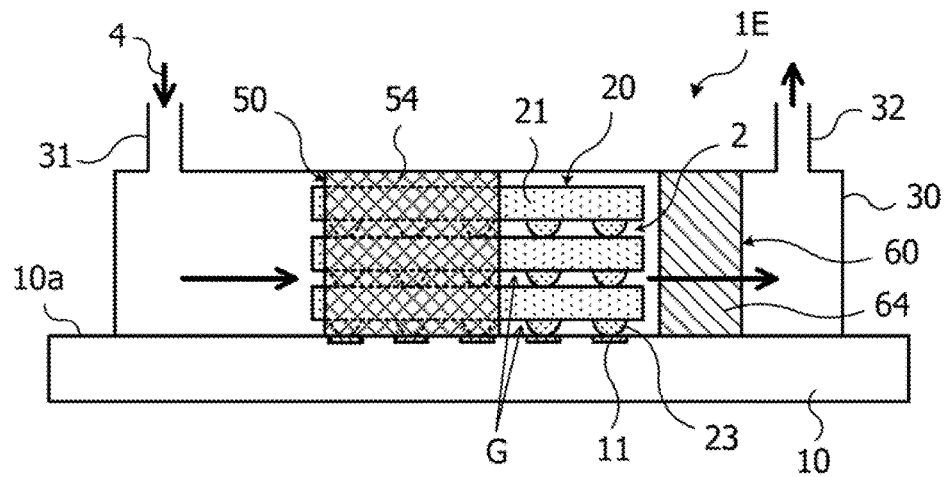
FIGS. 25A to 25C are views illustrating another example of a semiconductor module according to the fifth embodiment.
Figure 25B:
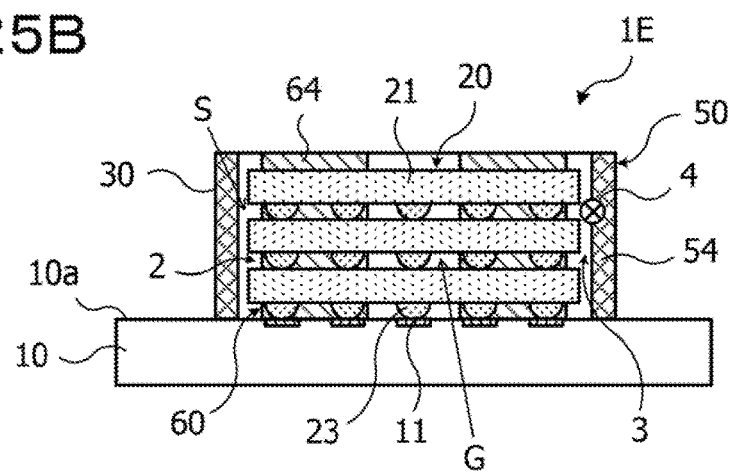
Figure 25C:
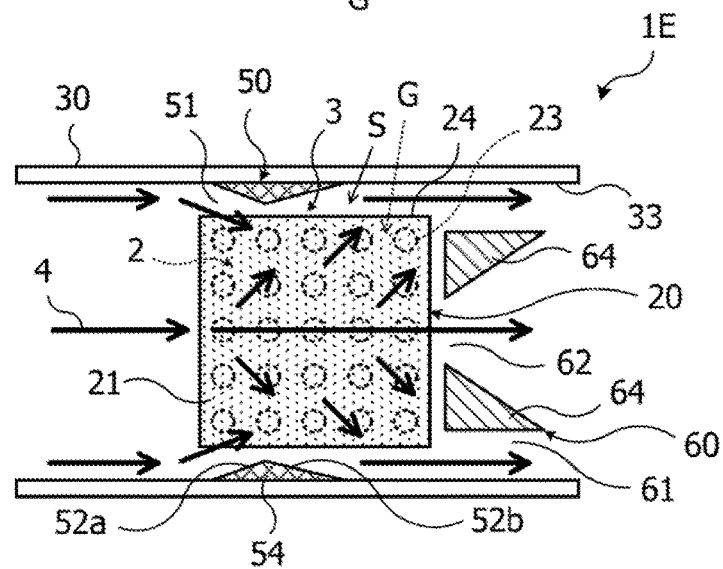

FIGS. 25A to 25C are views illustrating another example of a semiconductor module according to the fifth embodiment. Each of FIGS. 25A and 25B schematically illustrates a section of a main portion of another example of the semiconductor module according to the fifth embodiment. FIG. 25A is a schematic sectional view illustrating a main portion along a direction from upstream to downstream of a refrigerant, and FIG. 25B is a schematic sectional view illustrating a main portion along a direction perpendicular to the direction from upstream to downstream of a refrigerant. FIG. 25C is a schematic plan view illustrating a main portion in another example of the semiconductor module according to the fifth embodiment. The thick arrows illustrated in FIGS. 25A to 25C schematically illustrate a flow of a refrigerant.

A semiconductor module 1E illustrated in FIGS. 25A to 25C is different from the semiconductor module 1C according to the fourth embodiment in that a guide unit 40 is not provided at the upstream of a semiconductor device 20. That is, the semiconductor module 1E includes a guide unit 50 and a guide unit 60 as guide members. Thus, a configuration may be employed in which the guide unit 50 is provided at the arrangement region of the semiconductor device 20 within a container 30, and the guide unit 60 is provided at the downstream.

In the semiconductor module 1E as well, the refrigerant 4 flows to both a gap G and a side S of the semiconductor device 20 by the guide unit 50, and then a cooling effect of the semiconductor device 20 may be improved by the guide unit 60. Accordingly, a temperature variation and local heating of the semiconductor device 20 may be suppressed, thereby suppressing the performance degradation, damage, or the like of the semiconductor device 20. Thus, the semiconductor module 1E with a high performance and reliability is realized.

Next, a sixth embodiment will be described.

Figure 26A:
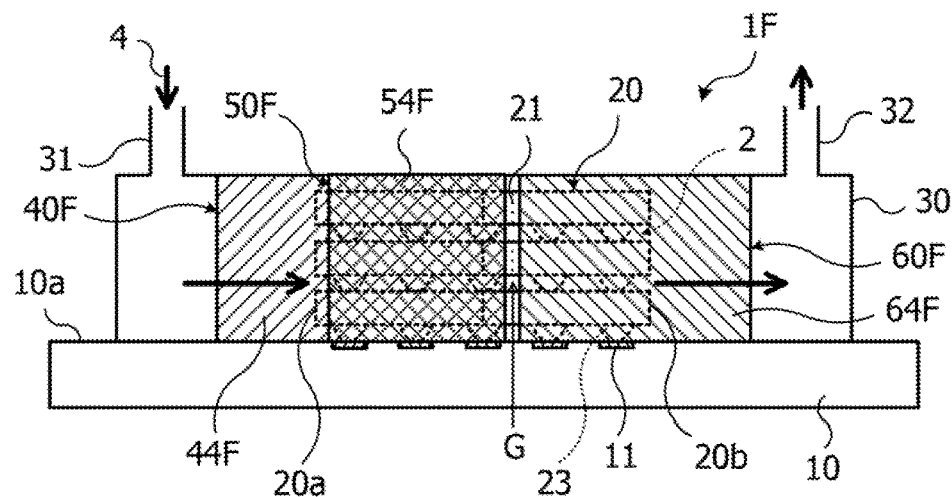
FIGS. 26A to 26C are views illustrating an exemplary semiconductor module according to a sixth embodiment.
Figure 26B:
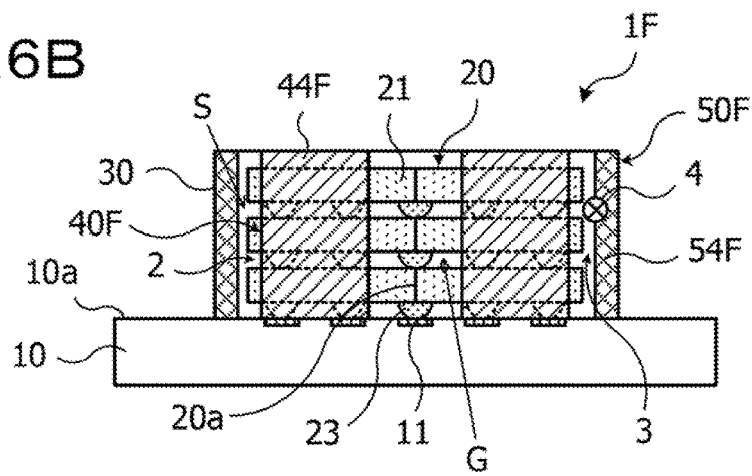
Figure 26C:
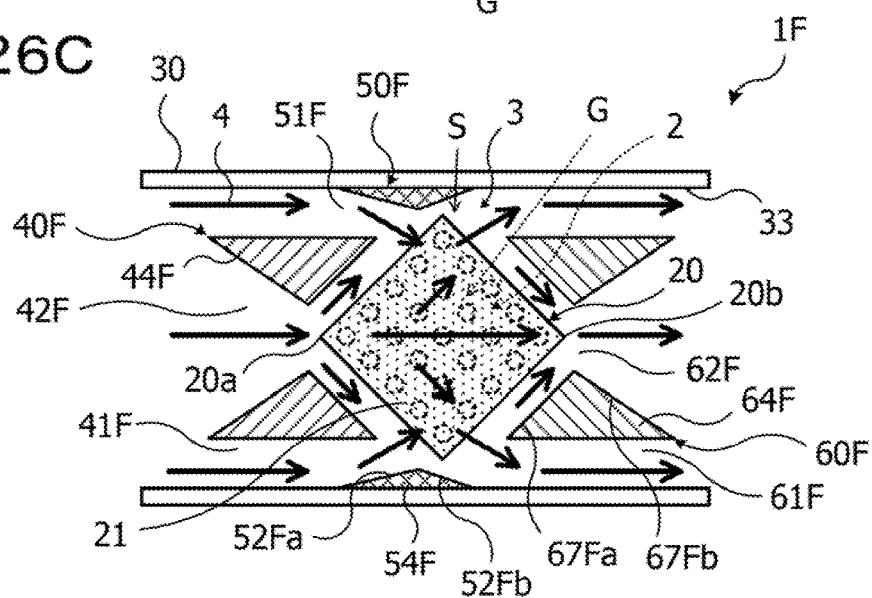

FIGS. 26A to 26C are views illustrating an exemplary semiconductor module according to a sixth embodiment. Each of FIGS. 26A and 26B schematically illustrates a section of a main portion of the exemplary semiconductor module according to the sixth embodiment. FIG. 26A is a schematic sectional view illustrating a main portion along a direction from upstream to downstream of a refrigerant, and FIG. 26B is a schematic sectional view illustrating a main portion along a direction perpendicular to the direction from upstream to downstream of a refrigerant. FIG. 26C is a schematic plan view illustrating a main portion of the exemplary semiconductor module according to the sixth embodiment. The thick arrows illustrated in FIGS. 26A to 26C schematically illustrate a flow of a refrigerant.

A semiconductor module 1F illustrated in FIGS. 26A to 26C includes a circuit board 10, a semiconductor device 20, a container 30, and a guide unit 40F, a guide unit 50F and a guide unit 60F. The semiconductor module 1F includes the guide unit 40F, the guide unit 50F and the guide unit 60F as guide members as described above.

In the semiconductor module 1F, the semiconductor device 20 is mounted on the circuit board 10 in such a manner that a corner 20a is directed to a supply port 31 side of the container 30 (the upstream of the refrigerant 4), and a diagonal corner 20b is directed to a discharge port 32 side of the container 30 (at the downstream of the refrigerant 4). As described above, within the container 30, the guide unit 40F is provided at the upstream of the semiconductor device 20 arranged on the circuit board 10, the guide unit 60F is provided at the downstream, and the guide unit 50F is provided between the guide unit 40F and the guide unit 60F.

The guide unit 40F at the upstream includes a pair of guides 44F which split the refrigerant 4 supplied from the supply port 31 into a flow path 41F at a side wall 33 side of the container 30, and a flow path 42F at the center side of the container 30. The flow path 42F is reduced in the flow passage area of the refrigerant 4 toward the semiconductor device 20.

The guide unit 50F at the midstream includes a pair of guides 54F each of which includes a portion 52Fa at the supply port 31 side, and a portion 52Fb at the discharge port 32 side. In the portion 52Fa, the area of a flow path 51F gradually decreases toward the downstream, and in the portion 52Fb, the area of the flow path 51F gradually increases toward the downstream. The guide 54F is provided spaced apart from the semiconductor device 20.

The guide unit 60F at the downstream includes a pair of guides 64F in which a flow path 61F at the side wall 33 side of the container 30 and a flow path 62F at the center side of the container 30 are formed. The guide 64F includes a portion 67Fa at the semiconductor device 20 side (at the supply port 31 side), in which the flow passage area gradually decreases toward the downstream, and a portion 67Fb at the discharge port 32 side, in which the flow passage area gradually increases toward the downstream.

The guide unit 40F, the guide unit 50F and the guide unit 60F may be formed using various materials such as a metal material, a ceramic material, or a resin material.

In the semiconductor module 1F provided with the guide unit 40F, the guide unit 50F, and the guide unit 60F, the refrigerant 4 supplied from the supply port 31 into the container 30 diverges into the flow path 41F and the flow path 42F of the guide unit 40F. The refrigerant 4 diverging into the flow path 41F side flows toward the guide unit 50F, and the refrigerant 4 diverging into the flow path 42F side flows toward the semiconductor device 20.

The refrigerant 4 diverging into the flow path 42F side flows toward the semiconductor device 20 while an increase of a flow resistance is suppressed and a flow velocity is increased because the flow path 42F becomes narrower toward the semiconductor device 20 side and the semiconductor device 20 is arranged with the corner 20a being directed to the upstream. The refrigerant 4 collides with the corner 20a and its periphery of the semiconductor device 20, and then flows into a gap G of the semiconductor device 20.

The refrigerant 4 diverging into the flow path 41F side collides with the upstream portion 52Fa of the guide 54F of the guide unit 50F, is deflected to the semiconductor device 20 side, and flows into the gap G. Since the guide 54F is spaced apart from the semiconductor device 20, the refrigerant 4 also flows to the guide unit 60F side through a side S of the semiconductor device 20.

Within the gap G of the semiconductor device 20, the refrigerant 4 flowing from the flow path 42F of the guide unit 40F collides with the refrigerant 4 flowing into the gap G after clashing with the portion 52Fa of the guide unit 50F. Then, the flow of the refrigerant 4 is disturbed within the gap G so that the refrigerant 4 flows in a wide range within the gap G. Then, the refrigerant 4 flows from the semiconductor device 20 to the guide unit 60F side.

The refrigerant 4 discharged from the semiconductor device 20 or flowing through the side S of the semiconductor device 20 diverges into the flow path 61F and the flow path 62F by the portion 67Fa of the guide 64F of the guide unit 60F. Both the refrigerant 4 diverging into the flow path 61F side and the refrigerant 4 diverging into the flow path 62F side flow to the discharge port 32 side of the container 30. In the guide unit 60F, since the width between the portions 67Fa at the semiconductor device 20 side becomes narrower toward the downstream along the side wall of the semiconductor device 20, the flow velocity of the refrigerant 4 flowing through the flow path 62F is increased.

By the shape and arrangement of the guide unit 40F, the guide unit 50F, and the guide unit 60F, the flow rate of the refrigerant 4 flowing through an internal path 2 in the gap G of the semiconductor device 20, and the flow rate of the refrigerant 4 flowing through an external path 3 at the side S of the semiconductor device 20 may be adjusted, respectively.

As an example, the width of the flow path 41F ranges from 0.1 mm to 1.0 mm, and the width of the flow path 42F ranges from 0.1 mm to 3.0 mm. The guide 54F is provided to leave a gap in a range of 0.1 mm to 1.0 mm between a boundary between the portion 52Fa and the portion 52Fb, and the semiconductor device 20. In the flow path 62F, the width between the portions 67Fa facing the semiconductor device 20 ranges from 0.2 mm to 1.0 mm. Each of the height of the flow path 41F and the flow path 42F, the height of the flow path 51F, and the height of the flow path 61F and the flow path 62F corresponds to the height of the container 30 (the inner space thereof) on the circuit board 10, or the mounting height of the semiconductor device 20.

When the guide unit 40F, the guide unit 50F and the guide unit 60F are provided within the container 30, the refrigerant 4 flows to the gap G and the side S of the semiconductor device 20 while the increase of the flow resistance is suppressed. Thus, a high cooling effect of the semiconductor device 20 may be obtained. Accordingly, a temperature variation and local heating of the semiconductor device 20 may be suppressed, thereby suppressing the performance degradation, damage, or the like of the semiconductor device 20. Thus, the semiconductor module 1F with a high performance and reliability is realized.

The guide unit 40F, the guide unit 50F and the guide unit 60F may be fixed to the container 30 according to the examples described for the guide unit 40, the guide unit 50, and the guide unit 60, respectively.

The guide unit 40F, the guide unit 50F, and the guide unit 60F may be formed as separate parts, or may be formed as one integrated part.

Also, in the described example, the guide unit 40F, the guide unit 50F and the guide unit 60F are provided, but among them, only the guide unit 40F, only the guide unit 50F, or only the guide unit 60F may be provided. Further, among the guide unit 40F, the guide unit 50F, and the guide unit 60F, only the guide unit 40F and the guide unit 50F, only the guide unit 40F and the guide unit 60F, or only the guide unit 50F and the guide unit 60F may be provided.

Figure 27:
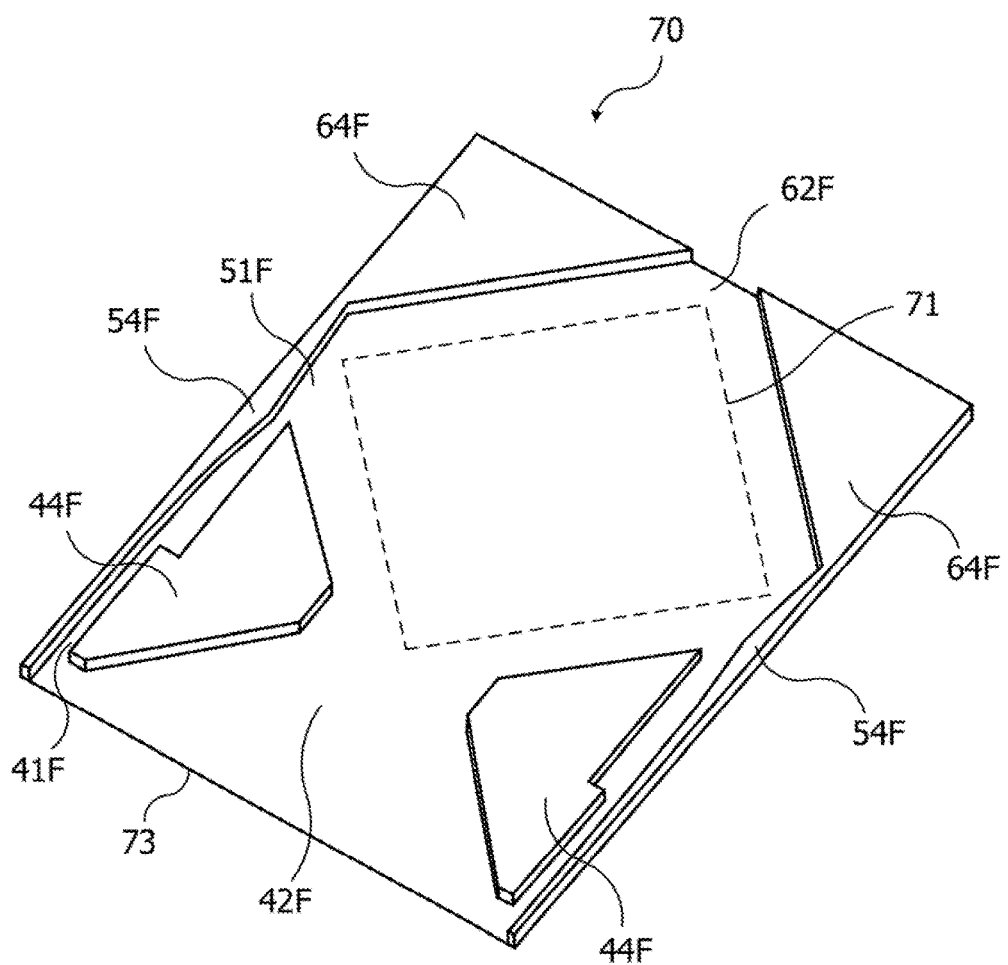
FIG. 27 is a view illustrating a first configuration example of a guide unit and a container according to the sixth embodiment.

A configuration example of a guide unit (a guide member) that realizes the functions of the guide unit 40F, the guide unit 50F, and the guide unit 60F is illustrated in FIG. 27.

FIG. 27 is a view illustrating a first configuration example of the guide unit and the container according to the sixth embodiment. FIG. 27 is a schematic perspective view illustrating the guide unit and the container.

For convenience, in FIG. 27, a position corresponding to the semiconductor device 20 is indicated by a dashed line 71. A guide unit 70 illustrated in FIG. 27 includes a support 73, and a pair of guides 44F, a pair of guides 54F, a pair of guides 64F provided on one surface of the support 73. A gap between the pair of guides 44F forms the flow path 42F, and the outside of the pair of guides 44F forms the flow paths 41F. A gap between the pair of guides 54F forms the flow path 51F. A gap between the pair of guides 64F forms the flow path 62F. A surface of the support 73 at the opposite side to the surface provided with the guides 44F, the guides 54F and the guides 64F comes in contact with a top wall 34 and a side wall 33 of the container 30 such that the guide unit 70 is provided in the container 30.

Although not illustrated herein, for example, the guide unit 70 may be provided in the container 30 by fitting laterally protruding protrusions in recesses formed in the side wall 33 of the container 30. Otherwise, the guide unit 70 may be provided in the container 30 by fitting upwardly protruding protrusions (formed in the depth direction of the drawing) in recesses formed in the top wall 34 of the container 30.

The guide unit 70 may be formed using various materials such as a metal material, a ceramic material, or a resin material.

Figure 28:
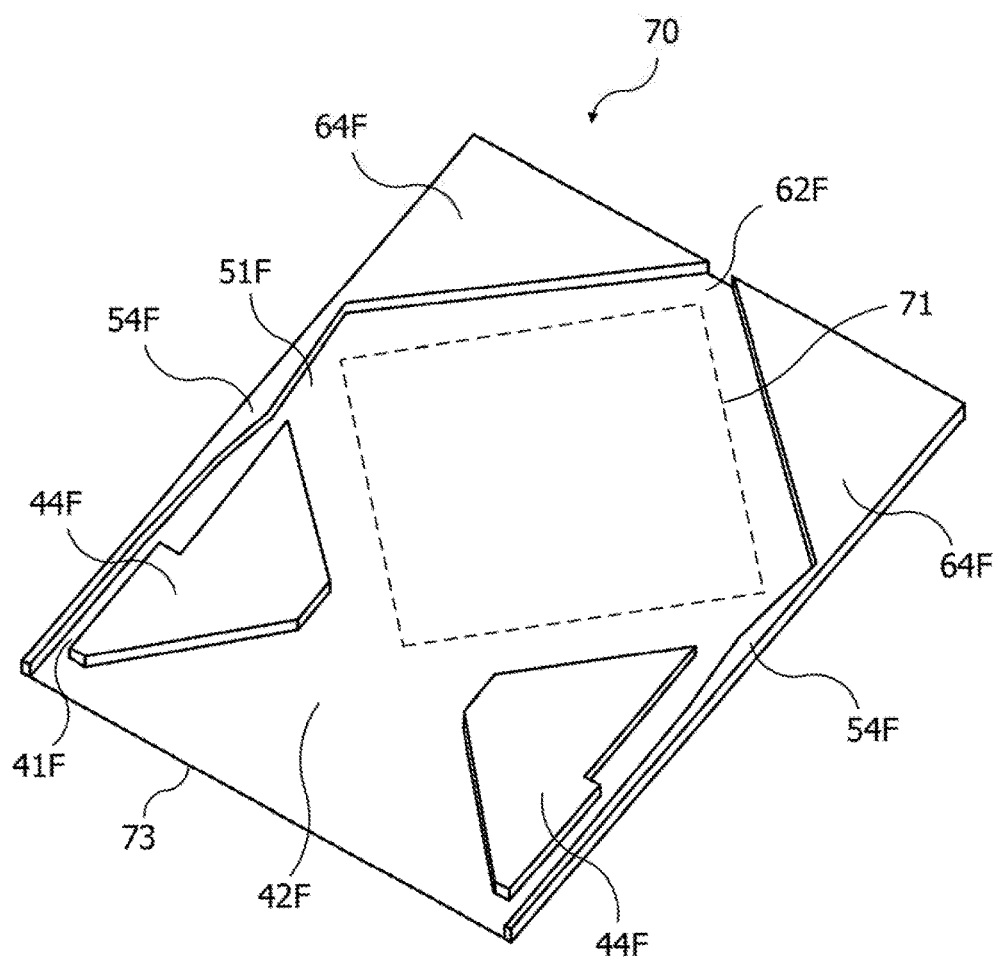
FIG. 28 is a view illustrating a second configuration example of a guide unit and a container according to the sixth embodiment.

FIG. 28 is a view illustrating a second configuration example of the guide unit and the container according to the sixth embodiment. FIG. 28 is a schematic perspective view illustrating the guide unit and the container.

For convenience, in FIG. 28, a position corresponding to the semiconductor device 20 is indicated by a dashed line 71. As illustrated in FIG. 28, an opening width (the width of the flow path 62F) of guides 64F at the downstream in a guide unit 70 may be narrower than the example of FIG. 27. In this case, the flow velocity of the refrigerant 4 flowing through the flow path 62F is increased. In the guide unit 70, by adjusting, for example, the opening width of the guides 64F in this manner, the flow rate of the refrigerant 4 flowing through the gap G of the semiconductor device 20, and the flow rate of the refrigerant 4 flowing through the side S of the semiconductor device 20 may be adjusted, respectively.

Similarly, by adjusting the opening width (the width of the flow path 42F) of guides 44F, or the opening width (the width of the flow path 51F) of guides 54F, the flow rate of the refrigerant 4 flowing through the gap G of the semiconductor device 20, and the flow rate of the refrigerant 4 flowing through the side S of the semiconductor device 20 may be adjusted, respectively.

Figure 29:
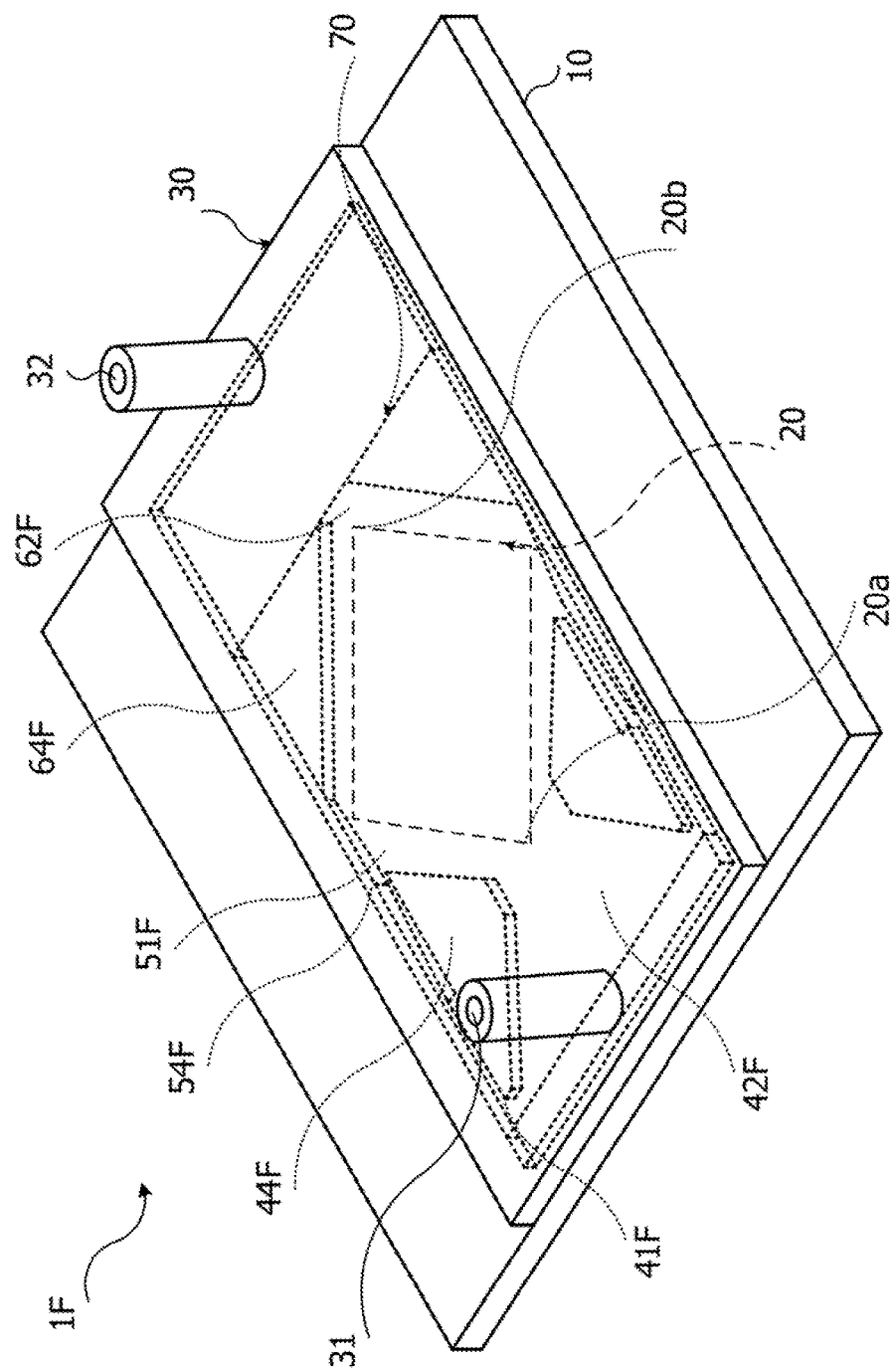
FIG. 29 is a view illustrating a configuration example of a semiconductor module according to the sixth embodiment.

FIG. 29 is a view illustrating a configuration example of the semiconductor module according to the sixth embodiment. FIG. 29 is a schematic perspective view illustrating the semiconductor module.

For example, the container 30 provided with the guide unit 70 illustrated in FIG. 27 is provided on the circuit board 10 mounted with the semiconductor device 20 to cover the semiconductor device 20. The semiconductor device 20 is arranged on the circuit board 10 in such a manner that the corner 20a is directed to the supply port 31 side (the diagonal corner 20b is directed to the discharge port 32 side). The semiconductor device 20 mounted on the circuit board 10 in such an orientation is covered with the container 30 provided with the guide unit 70, so that the semiconductor module 1F in which a sufficient cooling effect of the semiconductor device 20 is obtained is realized.

In the semiconductor modules 1, 1a, 1b, 1A, 1B, 1C, 1D, and 1E described in the first to fifth embodiments, as well, the semiconductor device 20 may be arranged on the circuit board 10 in such a manner that the corner 20a is directed to the supply port 31 side. Accordingly, the flow resistance of the refrigerant 4 flowing toward the semiconductor device 20 may be reduced so that the refrigerant 4 may easily flow into the gap G.

Next, a seventh embodiment will be described.

Figure 30A:
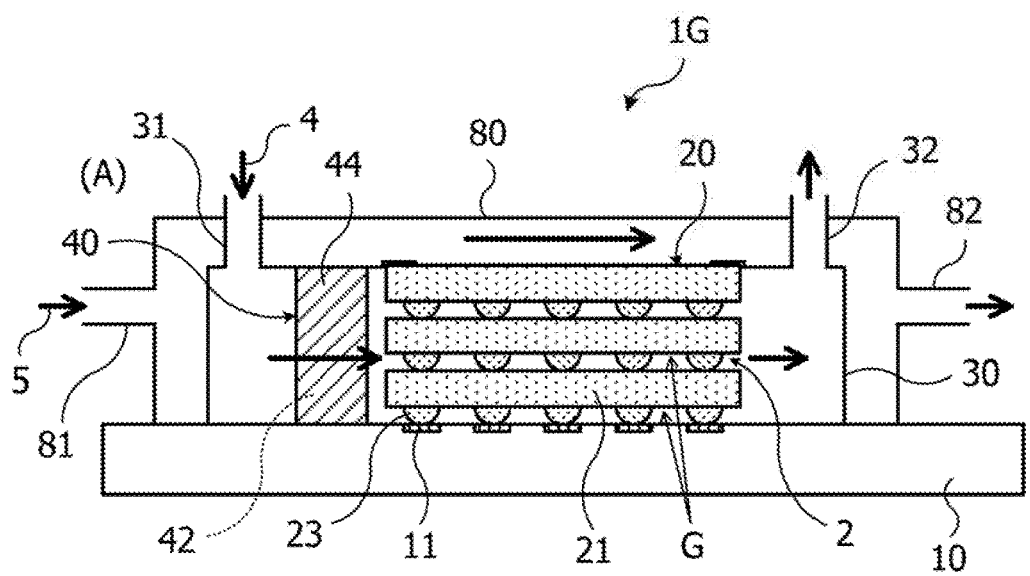
FIGS. 30A and 30B are views illustrating an exemplary semiconductor module according to a seventh embodiment.
Figure 30B:
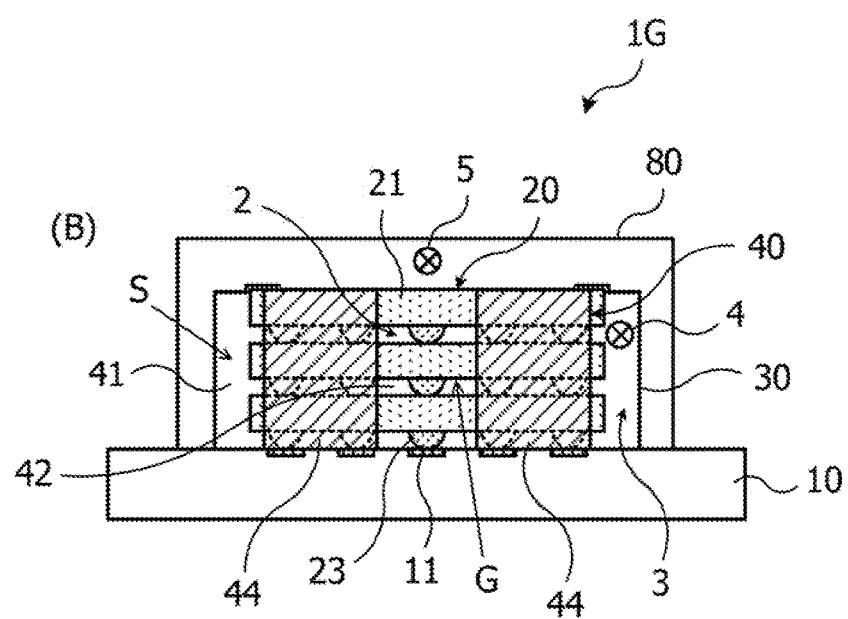

FIGS. 30A and 30B are views illustrating an exemplary semiconductor module according to a seventh embodiment. Each of FIGS. 30A and 30B schematically illustrates a section of a main portion of the exemplary semiconductor module according to the seventh embodiment. FIG. 30A is a schematic sectional view illustrating a main portion along a direction from upstream to downstream of a refrigerant, and FIG. 30B is a schematic sectional view illustrating a main portion along a direction perpendicular to the direction from upstream to downstream of a refrigerant. The thick arrows illustrated in FIGS. 30A and 30B schematically illustrate a flow of a refrigerant.

A semiconductor module 1G illustrated in FIGS. 30A and 30B includes a container 30 that covers the end portion of the top surface of a semiconductor device 20 (the top surface of the uppermost semiconductor element 21) such that a region inside the end portion is exposed. The semiconductor module 1G further includes a container 80 that covers the container 30. In this aspect, the semiconductor module 1G is different from the semiconductor module 1 according to the first embodiment. Here, as the semiconductor device 20, a device including semiconductor elements 21 stacked in two stages is exemplified.

In the semiconductor module 1G, a space within the inner container 30 that covers the semiconductor device 20, and a space within the outer container 80 that covers the container 30 are separated from each other. The outer container 80 includes a supply port 81 to which a refrigerant 5 is supplied, and a discharge port 82 from which the refrigerant 5 is discharged. As the refrigerant 5 to be supplied into the outer container 80 and the refrigerant 4 to be supplied into the inner container 30, refrigerants with different boiling points are used. For example, as the refrigerant 5 to be supplied into the container 80, a refrigerant having a lower boiling point than the refrigerant 4 to be supplied into the container 30 is used. As the refrigerant 4, a refrigerant with a boiling point that does not cause the refrigerant to be boiled when the heated semiconductor device 20 is cooled is used, and as the refrigerant 5, a refrigerant with a boiling point that causes the refrigerant to be boiled when the heated semiconductor device 20 is cooled is used.

Using the container 30 and the container 80, and using the refrigerant 4 and the refrigerant 5, the semiconductor device 20 may be cooled.

Figure 31:
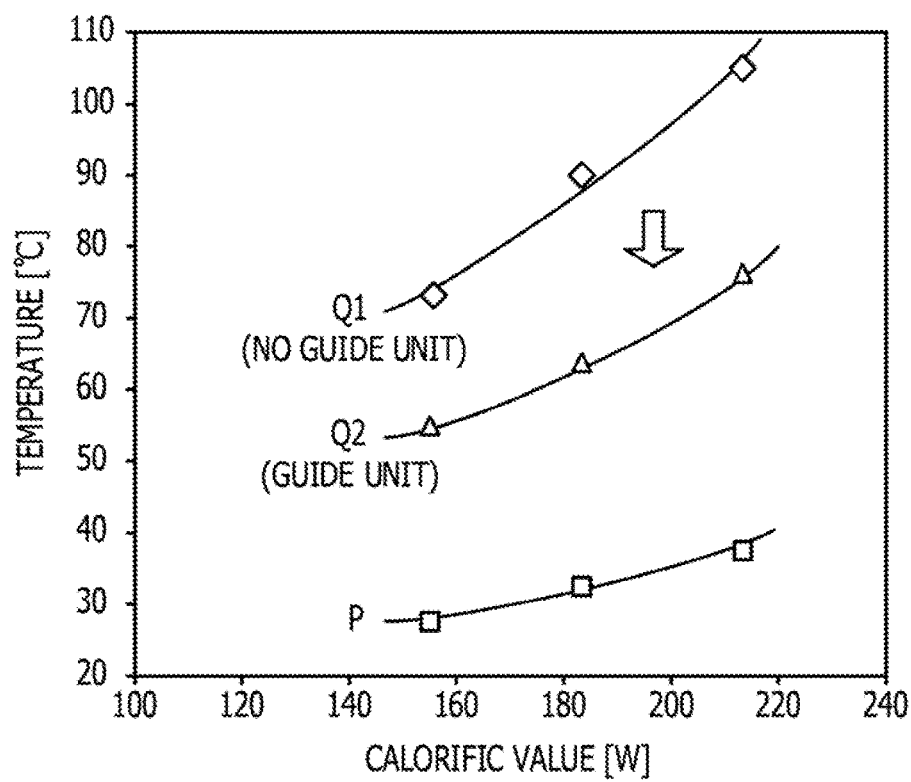
FIG. 31 is a view illustrating an example of a relationship between a calorific value and a temperature of the semiconductor element according to the seventh embodiment.

FIG. 31 is a view illustrating an example of a relationship between a calorific value and a temperature of the semiconductor element according to the seventh embodiment.

FIG. 31 illustrates an example of a relationship between a calorific value and a temperature of each of upper and lower semiconductor elements 21 of the semiconductor device 20, which is obtained in the semiconductor module 1G. FIG. 31 also illustrates an example of a relationship between a calorific value and a temperature of a lower semiconductor element 21, which is obtained in a semiconductor module not provided with the guide unit 40.

In the semiconductor module 1G, there is a tendency that the temperature of the lower semiconductor element 21 arranged within the container 30 is increased as compared to the upper semiconductor element 21 in contact with the refrigerant 5 of the container 80. When the guide unit 40 is not provided, although depending on the calorific values of the upper and lower semiconductor elements 21, the temperature difference (the temperature variation) between the lower semiconductor element 21 (Q1 in FIG. 31) and the upper semiconductor element 21 (P in FIG. 31) may range from, about 40° C. to 70° C. In contrast, as in the semiconductor module 1G, when the guide unit 40 is provided within the container 30, the temperature of the lower semiconductor element 21 (Q2 in FIG. 31) is reduced so that the temperature difference between the lower semiconductor element 21 and the upper semiconductor element 21 (P in FIG. 31) may be suppressed to a range of 20° C. to 40° C.

By the guide unit 40, a temperature variation and local heating of the semiconductor device 20 may be suppressed, thereby suppressing the performance degradation, damage, or the like of the semiconductor device 20. Thus, the semiconductor module 1G with a high performance and reliability is realized.

Herein, as the guide member of the semiconductor module 1G, only the guide unit 40 is exemplified, but the guide unit 50, and the guide unit 60, or the guide unit 40F, the guide unit 50F, and the guide unit 60F may be provided within the inner container 30. Accordingly, the same effect described for a case where each of the guide members is provided may be achieved in the adjustment of the flow rate of the refrigerant 4 flowing through each of the internal path 2 and the external path 3 of the semiconductor device 20 arranged within the container 30 and the cooling according to the adjustment. The guide unit 60, the guide unit 40F, and the guide unit 60F may be provided within the container 30 according to the examples described above. The guide unit 50 or the guide unit 50F provided at the arrangement region of the semiconductor device 20 may be provided within the container 30 by fixing each of the pair of guides 54 or guides 54F to the side wall 33 of the container 30.

The semiconductor modules 1, 1a, 1b, 1A, 1B, 1C, 1D, 1E, 1F, and 1G described for the first to seventh embodiments as described above may be used for various electronic devices. For example, they may be used in various electronic devices such as a computer (e.g., a PC, a supercomputer, or a server), a smart phone, a mobile phone, a tablet terminal, a sensor, a camera, an audio device, a measuring instrument, an inspection device, or a manufacturing device.

Figure 32:
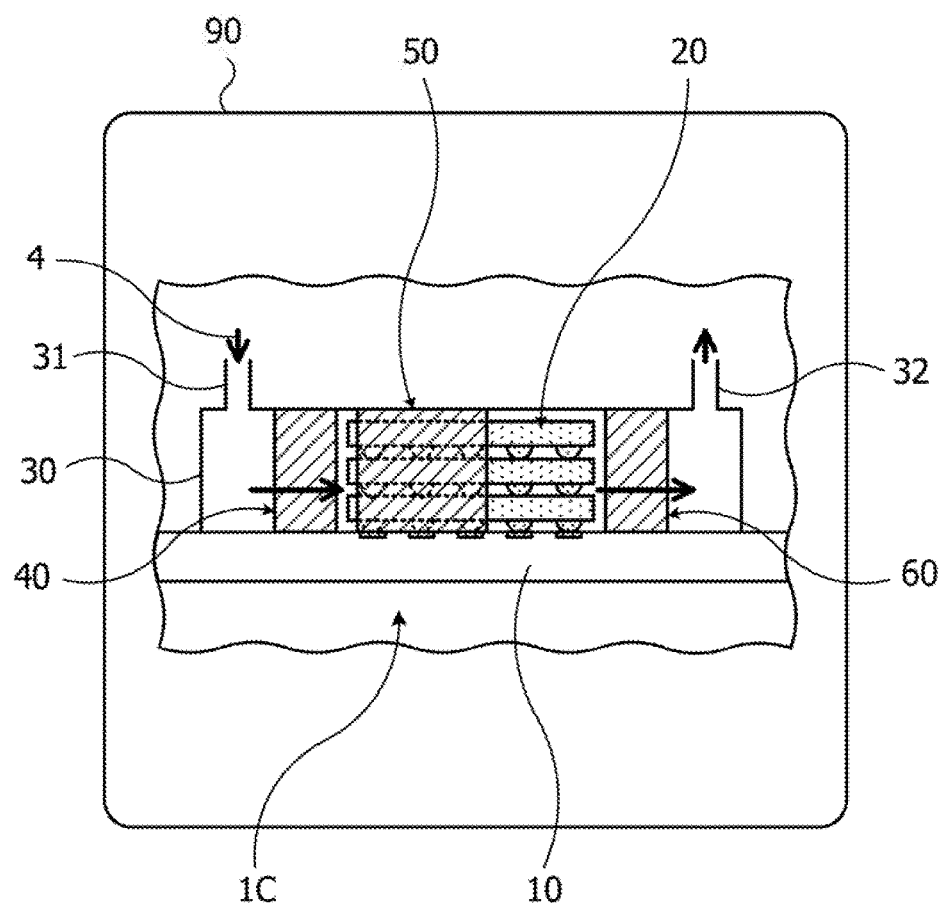
FIG. 32 is a view illustrating an exemplary electronic device.

FIG. 32 is a view illustrating an exemplary electronic device. FIG. 32 schematically illustrates the exemplary electronic device. As illustrated in FIG. 32, for example, the semiconductor module 1C illustrated in FIGS. 19A to 19C is mounted (embedded) in various electronic devices 90 as exemplified above.

In the semiconductor module 1C, by the guide unit 40, the guide unit 50, and the guide unit 60, the refrigerant 4 supplied from the supply port 31 into the container 30 flows through both the gap G and the side S of the semiconductor device 20. Thus, a sufficient cooling effect of the semiconductor device 20 may be obtained. As a result, a temperature variation and local heating of the semiconductor device 20 may be suppressed, thereby suppressing the performance degradation, damage, or the like of the semiconductor device 20. Accordingly, the semiconductor module 1C with a high performance and reliability is realized, and thus, the electronic device 90 having a high performance and reliability, which is mounted with the semiconductor module 1C, is realized.

Also, electronic devices mounted with other semiconductor modules 1, 1a, 1b, 1A, 1B, 1D, 1E, 1F, 1G and the like may also be similarly realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A semiconductor module comprising:
    a container through which a refrigerant flows;
    a semiconductor device installed within the container and having an internal path through which the refrigerant flows; and
    a guide member installed within the container to adjust a first flow rate of the refrigerant flowing through the internal path, and a second flow rate of the refrigerant flowing outside the semiconductor device,
    the semiconductor device includes:
        a first semiconductor element; and
        a second semiconductor element mounted over the first semiconductor element, and the internal path is formed between the first semiconductor element and the second semiconductor element.

2. The semiconductor module according to claim 1, wherein the container includes:
a supply port formed at one side of the semiconductor device, to which the refrigerant is supplied, and
a discharge port formed at another side of the semiconductor device, from which the refrigerant is discharged.

3. The semiconductor module according to claim 1, wherein the guide member includes a first guide unit installed at an upstream side of the refrigerant in the semiconductor device to adjust the first flow rate and the second flow rate.

4. The semiconductor module according to claim 3, wherein the first guide unit includes a first flow path and a second flow path which diverge from each other, and
wherein the first flow path is formed along a side wall of the container, and the second flow path is formed inside the first flow path, and becomes narrower in a flow passage area of the refrigerant while getting closer to the semiconductor device.

5. The semiconductor module according to claim 4, wherein the second flow path becomes narrower in the flow passage area of the refrigerant from the side wall side of the container to a center side while getting closer to the semiconductor device.

6. The semiconductor module according to claim 4, wherein the second flow path becomes narrower in the flow passage area of the refrigerant from a top side or a bottom side of the container to a center side while getting closer to the semiconductor device.

7. The semiconductor module according to claim 1, wherein the guide member includes a second guide unit installed outside the semiconductor device when viewed in a flow direction of the refrigerant to adjust the first flow rate and the second flow rate.

8. The semiconductor module according to claim 7, wherein the second guide unit includes a third flow path between a side wall of the container and a side wall of the semiconductor device.

9. The semiconductor module according to claim 8, wherein the third flow path partially becomes narrower in a flow passage area of the refrigerant from the side wall side of the container to the semiconductor device side.

10. The semiconductor module according to claim 1, wherein the guide member includes a third guide unit installed at a downstream side of the refrigerant in the semiconductor device to adjust the first flow rate and the second flow rate.

11. The semiconductor module according to claim 10, wherein the third guide unit includes a fourth flow path and a fifth flow path which diverge from each other, and
wherein the fourth flow path is formed along a side wall of the container, and the fifth flow path is formed inside the fourth flow path and becomes narrower in a flow passage area of the refrigerant while getting closer to the semiconductor device.

12. The semiconductor module according to claim 10, wherein the third guide unit includes a sixth flow path which guides the refrigerant from a side wall side of the container to a center side, causing the refrigerant to flow to the downstream side.

13. The semiconductor module according to claim 1, wherein the semiconductor device has a rectangular shape in a plan view, and is installed within the container while one corner of the semiconductor device is directed to an upstream side of the refrigerant.

14. The semiconductor module according to claim 1, further comprising a board mounted with the semiconductor device,
wherein the container is mounted over the board to accommodate the semiconductor device.

15. The semiconductor module according to claim 1, wherein a top surface of the semiconductor device is exposed from the container, and
the semiconductor module further includes a cooling unit to cool the top surface.

16. An electronic device comprising:
a semiconductor module, the semiconductor module includes:
a container through which a refrigerant flows;
a semiconductor device installed within the container and having an internal path through which the refrigerant flows; and
a guide member installed within the container to adjust a first flow rate of the refrigerant flowing through the internal path, and a second flow rate of the refrigerant flowing outside the semiconductor device,
the semiconductor device includes:
a first semiconductor element; and
a second semiconductor element mounted over the first semiconductor element,
the internal path is formed between the first semiconductor element and the second semiconductor element.

* * * * *